(12) United States Patent
Mori

(10) Patent No.: US 7,884,977 B2
(45) Date of Patent: Feb. 8, 2011

(54) METHOD, DEVICE AND COMPUTER PROGRAM FOR PROCESSING INPUT DATA CONCERNING GENERATION OF ELECTRONIC FILES

(75) Inventor: Toshihiro Mori, Neyagawa (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 860 days.

(21) Appl. No.: 11/882,428

(22) Filed: Aug. 1, 2007

(65) Prior Publication Data
US 2008/0030812 A1 Feb. 7, 2008

(30) Foreign Application Priority Data
Aug. 2, 2006 (JP) .............................. 2006-211157

(51) Int. Cl.
*H04N 1/46* (2006.01)
(52) U.S. Cl. ...................... 358/505; 358/515; 358/528; 358/538
(58) Field of Classification Search ................. 358/505, 358/515, 528, 532, 538
See application file for complete search history.

(56) References Cited

U.S. PATENT DOCUMENTS 5,900,948 A * 5/1999 Shigeeda et al. ............ 358/448
6,731,800 B1 * 5/2004 Barthel et al. ............... 382/176
7,164,493 B1 * 1/2007 Matsumoto et al. .......... 358/1.9
2005/0180645 A1 8/2005 Hasegawa et al.

FOREIGN PATENT DOCUMENTS

| JP | 06-175633 | 6/1994 |
|---|---|---|
| JP | 10-074248 | 3/1998 |
| JP | 2003-018412 | 1/2003 |
| JP | 2003-338934 | 11/2003 |
| JP | 2005-012768 | 1/2005 |

OTHER PUBLICATIONS

Japanese Office Action mailed on Sep. 2, 2008 directed towards counterpart foreign application No. 2006-211157; 5 pages.

* cited by examiner

*Primary Examiner*—Houshang Safaipour
(74) *Attorney, Agent, or Firm*—Morrison & Foerster LLP

(57) ABSTRACT

The image processing device is provided with an area process portion for generating objects indicating specific areas included in original image data of an scanned original and for discriminating whether each of the objects is a character object or a non-character object, an integration process portion for performing a process of integrating character objects that satisfy a first condition so as to make one character object and a process of integrating character objects that have remained after integration and satisfy a second condition if the number of the remaining character objects is larger than a preset value, a lossless compression portion for performing a lossless compression process on a character object, and a lossy compression portion for performing a lossy compression process on a non-character object.

18 Claims, 26 Drawing Sheets

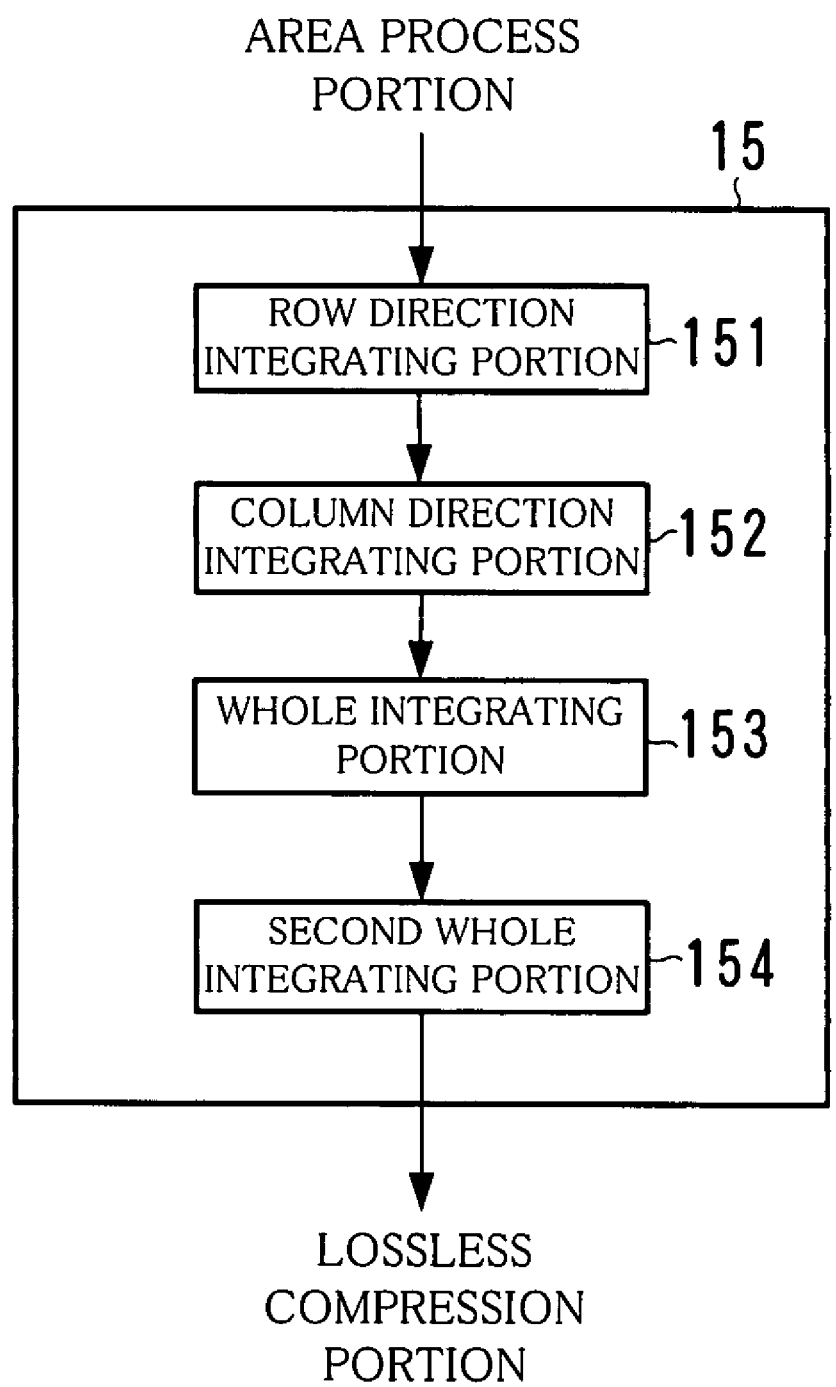

| | BEFORE INTEGRATION |||||| CHARACTER OBJECT OBMc AFTER INTEGRATION |||| CHARACTER COLOR DIFFERNCE BEFORE AND AFTER INTEGRATION |||
|---|---|---|---|---|---|---|---|---|---|---|---|---|---|
| | CHARACTER OBJECT OBMa |||| CHARACTER OBJECT OBMb ||||| | | | | | |
| NUMBER | NUMBER OF PIXELS | R | G | B | NUMBER | NUMBER OF PIXELS | R | G | B | NUMBER OF PIXELS | R | G | B | OBMa | OBMb | MAX |
| 31 | 1000 | 202 | 151 | 14 | 32 | 50 | 195 | 72 | 63 | 1050 | 201 | 147 | 16 | 5 | 89 | 89 |
| | | | | | 33 | 200 | 111 | 211 | 120 | 1200 | 186 | 161 | 31 | 25 | 127 | 127 |
| | | | | | 34 | 100 | 37 | 195 | 3 | 1100 | 187 | 155 | 13 | 16 | 156 | 156 |
| | | | | | 35 | 30 | 220 | 90 | 64 | 1030 | 202 | 149 | 15 | 2 | 79 | 79 |
| | | | | | 36 | 70 | 212 | 160 | 11 | 1070 | 202 | 151 | 13 | 1 | 14 | 14 |
| 32 | 50 | 195 | 72 | 63 | 33 | 200 | 111 | 211 | 120 | 250 | 127 | 183 | 108 | 138 | 34 | 138 |
| | | | | | 34 | 100 | 37 | 195 | 3 | 150 | 89 | 154 | 23 | 140 | 69 | 140 |
| | | | | | 35 | 30 | 220 | 90 | 64 | 80 | 204 | 78 | 63 | 11 | 20 | 20 |
| | | | | | 36 | 70 | 212 | 160 | 11 | 120 | 204 | 123 | 32 | 60 | 43 | 60 |
| 33 | 200 | 111 | 211 | 120 | 34 | 100 | 37 | 195 | 3 | 300 | 86 | 205 | 81 | 47 | 93 | 93 |
| | | | | | 35 | 30 | 220 | 90 | 64 | 230 | 125 | 195 | 112 | 23 | 150 | 150 |
| | | | | | 36 | 70 | 212 | 160 | 11 | 270 | 137 | 197 | 91 | 41 | 116 | 116 |
| 34 | 100 | 37 | 195 | 3 | 35 | 30 | 220 | 90 | 64 | 130 | 79 | 170 | 17 | 51 | 169 | 169 |
| | | | | | 36 | 70 | 212 | 160 | 11 | 170 | 109 | 180 | 6 | 74 | 105 | 105 |
| 35 | 30 | 220 | 90 | 64 | 36 | 70 | 212 | 160 | 11 | 100 | 214 | 139 | 26 | 62 | 26 | 62 |

| | BEFORE INTEGRATION |||||||||| CHARACTER OBJECT OBMc AFTER INTEGRATION ||||| CHARACTER COLOR DIFFERNCE BEFORE AND AFTER INTEGRATION |||
|---|---|---|---|---|---|---|---|---|---|---|---|---|---|---|---|---|---|---|
| | CHARACTER OBJECT OBMa |||| CHARACTER OBJECT OBMb ||||||||||||||
| NUMBER | NUMBER OF PIXELS | R | G | B | NUMBER | NUMBER OF PIXELS | R | G | B | NUMBER OF PIXELS | R | G | B | OBMa | OBMb | MAX |
| 316 | 1070 | 202 | 151 | 13 | 32 | 50 | 195 | 72 | 63 | 1120 | 201 | 148 | 15 | 5 | 90 | 90 |
| | | | | | 33 | 200 | 111 | 211 | 120 | 1270 | 187 | 160 | 29 | 24 | 129 | 129 |
| | | | | | 34 | 100 | 37 | 195 | 3 | 1170 | 187 | 155 | 12 | 15 | 156 | 156 |
| | | | | | 35 | 30 | 220 | 90 | 64 | 1100 | 202 | 150 | 14 | 2 | 80 | 80 |
| 32 | 50 | 195 | 72 | 63 | 33 | 200 | 111 | 211 | 120 | 250 | 127 | 183 | 108 | 138 | 34 | 138 |
| | | | | | 34 | 100 | 37 | 195 | 3 | 150 | 89 | 154 | 23 | 140 | 69 | 140 |
| | | | | | 35 | 30 | 220 | 90 | 64 | 80 | 204 | 78 | 63 | 11 | 20 | 20 |
| 33 | 200 | 111 | 211 | 120 | 34 | 100 | 37 | 195 | 3 | 300 | 86 | 205 | 81 | 47 | 93 | 93 |
| | | | | | 35 | 30 | 220 | 90 | 64 | 230 | 125 | 195 | 112 | 23 | 150 | 150 |
| 34 | 100 | 37 | 195 | 3 | 35 | 30 | 220 | 90 | 64 | 130 | 79 | 170 | 17 | 51 | 169 | 169 |

METHOD, DEVICE AND COMPUTER PROGRAM FOR PROCESSING INPUT DATA CONCERNING GENERATION OF ELECTRONIC FILES

This application is based on Japanese patent application No. 2006-211157 filed on Aug. 2, 2006, the contents of which are hereby incorporated by reference.

BACKGROUND OF THE INVENTION

1. Field of the Invention

The present invention relates to a method, a device and a computer readable medium storing a program for processing input data concerning generation of an electronic file.

2. Description of the Prior Art

Recently, MFPs (Multi Function Peripherals) have moved from types of monochrome image processing to types capable of color image processing (e.g., a color MFP).

Such an MFP capable of color image processing usually has a function of attaching image data of an original read (scanned) by a scanner to electronic mail and transmitting the electronic mail directly therefrom.

However, if an A4 original is scanned as a 300 dpi full color image data, the quantity of data becomes approximately 25 MB, which is not suitable for transmission by electronic mail.

Therefore, the image data of the scanned original are usually compressed before being transmitted. However, lossy compression becomes necessary in order to compress the image data at high compression ratio to have a quantity of data suitable for transmission by electronic mail. If the compression is performed at high compression ratio so as to reduce the quantity of data, then a part of character in the image may be too blurred to read. Although it is necessary to reduce the compression ratio in order to avoid this, then it is difficult to reduce the quantity of data sufficiently.

Therefore, a function named a high compression PDF (compact PDF) is used conventionally. In this function, instead of using the same compression method for the whole image data, different compression methods are used for different areas to be processed. Thus, it is possible to generate a PDF file having a small quantity of data (file size) while legibility of characters is secured.

Specifically, each area (object) is extracted from image data of an original scanned by an MFP or the like by word or line in accordance with a predetermined rule, and it is determined whether the area is a character area (character object) including characters or a non-character area (non-character object) including no character.

As to every character object, one typical color about a color or the like of characters included in the character object is set. Then, character objects having similar typical colors are integrated into one character object. Alternatively, character objects are integrated based on a distance between them or an increasing degree of unnecessary blank pixels that will be generated when the character objects are integrated.

Further, image data of a part corresponding to the character object are digitized to be binary data (binarized) with maintenance of a high resolution. As to the non-character object, the resolution thereof is reduced without making binary data for maintaining its gradation property. Then, it is compressed with a high compression ratio.

In addition, there is another method for reducing a file size as described below.

A color space is divided, in advance, into a predetermined number of blocks, and each character object is assigned to a block having a similar color. Thus, the number of objects is limited within the predetermined number so that an increase of the file size can be suppressed.

In addition, it is also possible to reduce the file size by reducing the number of colors that are used in the image data using conventional methods described below.

According to the first method described in Japanese unexamined patent publication No. 10-74248, colors are reduced by using a look-up table storing color conversion information so as to assign a color of each pixel of an input image to one of limited colors.

According to the second method described in Japanese unexamined patent publication No. 6-175633, a ratio of each color from R, G and B color data of input image data of multi colors is calculated so as to divide them into groups corresponding to the desired number of colors and to determine a typical color. A color area having a plurality of typical colors is regarded as an unknown area, and it is estimated whether the unknown area is a pattern or not from a difference between a color of an edge or a center portion of the unknown area and a color of a peripheral portion or the like. If it is a pattern, it is decided to be a different color from the periphery portion. If it is not a pattern, it is decided to be the same color as the periphery portion.

As described above, the conventional method integrates objects in accordance with a typical color of the object, a distance of the same, and an increasing degree of unnecessary blank pixels that will be generated due to the integration. Then, objects that have remained after that are used for generating a file. In this method, the number of objects may not be reduced sufficiently because the number of objects that have remained after the integration depends on a type of the original or the like. In this case, the file size may be increased.

In addition, the conventional method compares an attribution such as the typical color of every object with that of each of other objects when the objects are integrated. Therefore, if the number of the objects is huge, the process for the comparison may take a lot of time.

In addition, the method of compressing the non-character object with high compression ratio while maintaining a high resolution of image data corresponding to the character object should extract a part of characters from image data of the scanned original image. In other words, an area including characters must be determined to be the character area. If it is determined incorrectly, image data of the area is compressed at high compression ratio after the resolution thereof is reduced, so characters in the area may be unreadable. In fact, there is a possibility that the characters cannot be read because distinguishing a character area and a non-character area is difficult.

According to the method of dividing the color space into a predetermined number of blocks in advance, in an object including a character having a color on a boundary between blocks or a vicinity thereof, the color of the character is divided into one of the blocks and the other, so unevenness of colors may be generated.

According to the first method described above, the process of reducing colors is realized by assigning the limited color to each pixel. In this method too, unevenness of colors may be generated at a boundary between a group of pixels to which a certain limited color is assigned and another group of pixels to which another limited color is assigned or vicinity thereof.

Even if the second method described above is used, unevenness of colors may be generated for the same reason.

SUMMARY

An object of an embodiment of the present invention is to reduce a file size substantially while suppressing a generation of unevenness of colors and maintaining legibility of characters.

A method for processing input data according to an aspect of the present invention is a method for processing the input data when an electronic file is generated from the input data. The method includes generating objects indicating specific areas included in the input data, integrating objects satisfying a first condition among the generated objects so as to make one object, and comparing the number of objects that have remained after a process of the integration with a preset value and for integrating objects satisfying a second condition among the objects that have remained if the number of objects is larger than the preset value.

Preferably, the process of comparison may include repeating a process of integrating objects satisfying the second condition until the number of objects that have remained after the integration becomes the preset value or less.

Preferably, objects may include a character object about an area of characters and a non-character object about an area except for characters, and a process of the integration and the comparison is performed on the character object.

Preferably, the character object that has remained after a process of the comparison may be compressed in a lossless compression manner, while the non-character object is compressed in a lossy compression manner.

Preferably, a parameter that is used for the lossy compression may be determined based on a quantity of data generated by the lossless compression of the character object.

A processing apparatus according to another aspect of the present invention is a processing apparatus for generating an electronic file from input data. The processing apparatus includes a generating portion that generates objects indicating specific areas included in the input data, a determining portion that determines whether an object generated by the generating portion is a character object about an area of characters or a non-character object about an area except for characters, a first integrating portion that integrates objects satisfying a first condition among character objects so as to make one new character object, a second integrating portion that compares the number of character objects that have remained after a process of the integration performed by the first integrating portion with a preset value and integrates objects satisfying a second condition among the character objects that have remained if the number of character objects is larger than the preset value, a lossless compression portion that compresses in a lossless manner character objects that have remained after a process of the integration performed by the second integrating portion, and a lossy compression portion for compressing non-character objects in a lossy manner.

According to an embodiment of the present invention, when an electronic file is generated based on image data of a scanned original, a file size thereof can be reduced substantially while suppressing generation of unevenness of colors and maintaining legibility of characters.

BRIEF DESCRIPTION OF THE DRAWINGS

FIG. 16 is a diagram showing a structure of an integration process portion.

FIG. 19 is a first diagram showing attribution values of character objects before and after integration supposing that two character objects are integrated.

FIG. 20 is a second diagram showing attribution values of character objects before and after integration supposing that two character objects are integrated.

DESCRIPTION OF THE PREFERRED EMBODIMENTS

The preferred embodiment of the invention will now be described in detail with reference to the attached drawings.

[Hardware Structure of Image Processing Device]

In this embodiment, the image processing device 1 converts an image of an original read by the scanner or the like into an electronic file having a format such as PDF and stores the file. In addition, it attaches the stored electronic file to electronic mail so as to transmit the same or performs a printing process based on the electronic file. Following description is about an example in which an MFP (Multi Function Peripherals) capable of color image processing, that is, a color MFP is used as the image processing device 1.

Figure 1:
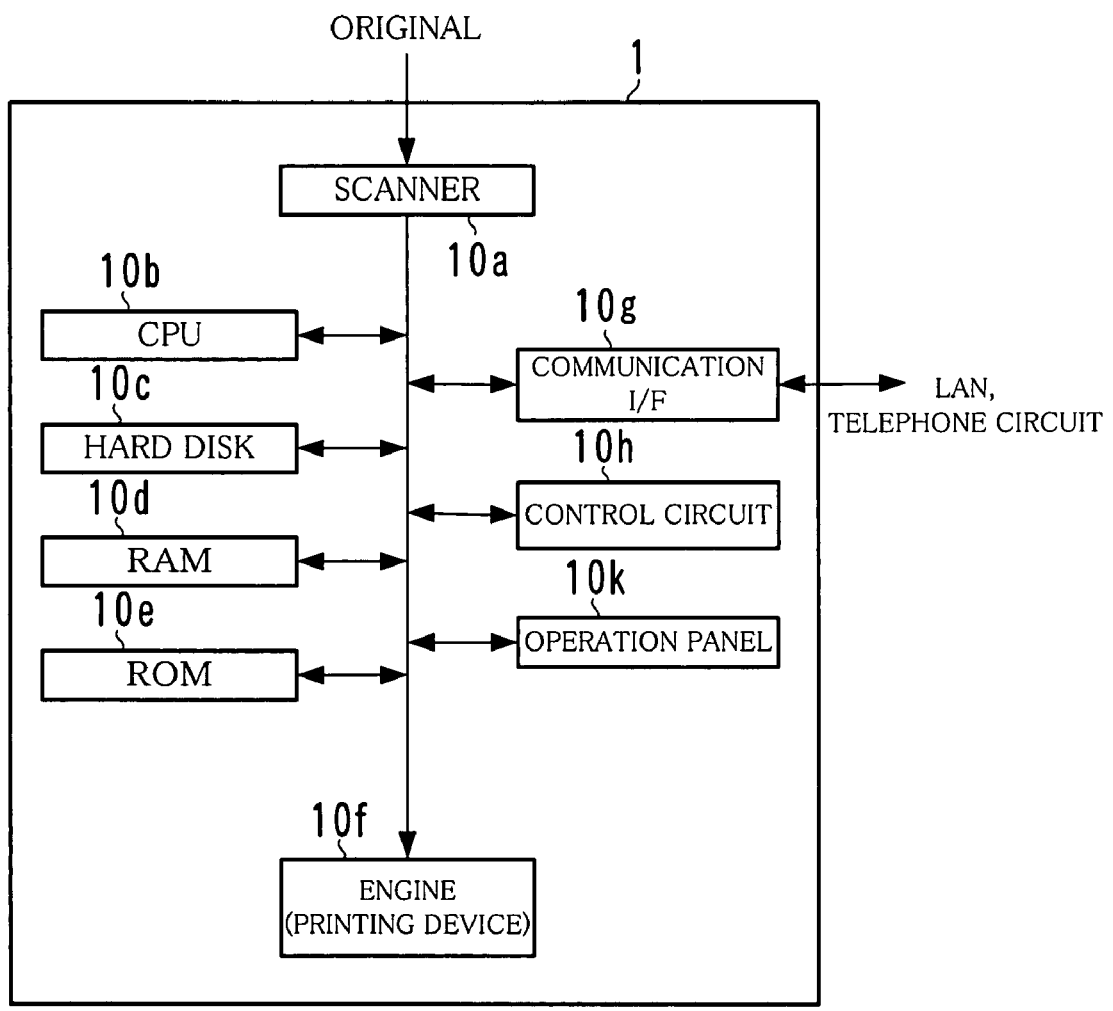
FIG. 1 is a diagram showing an example of a hardware structure of an image processing device according to an embodiment of the present invention.

As shown in FIG. 1, the image processing device 1 is made up of the scanner 10a, a CPU 10b, a hard disk 10c, a RAM 10d, a ROM 10e, a printing device 10f, a communication interface 10g, a control circuit 10h, an operation panel 10k and the like.

The scanner 10a is a device for reading optically a photograph, characters, a picture, or a chart on an original so as to generate and output image data.

The CPU 10b performs a process for converting the image data of the original read by the scanner 10a into a file having a format such as TIFF, JPEG, bitmap, PDF or the like. It also performs a general control of the image processing device 1, such as detection of an input from a user, display control of the operation panel 10k, generation of electronic mail and the like.

Figure 4:
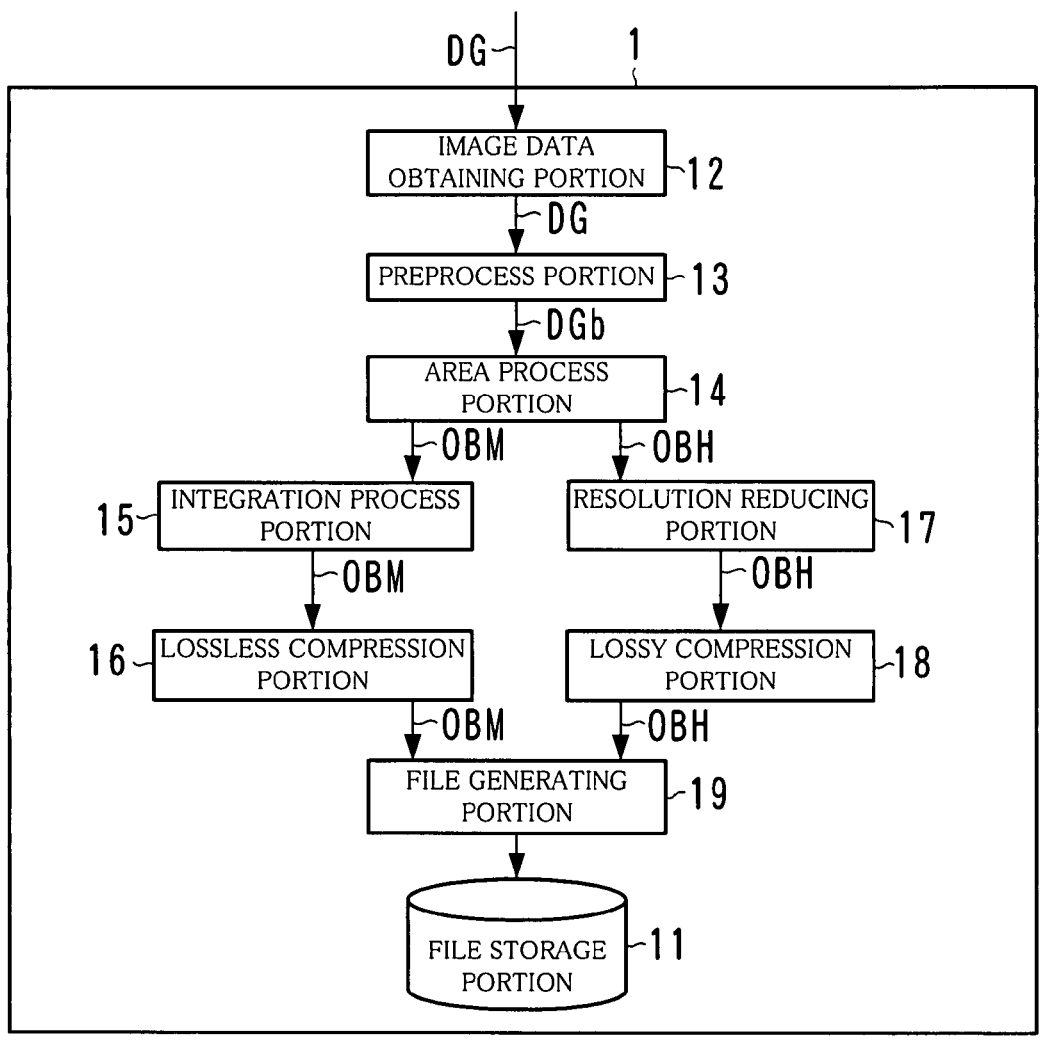
FIG. 4 is a diagram showing an example of a functional structure of the image processing device.

In the hard disk 10c a program and data are installed for realizing functions of each portion as shown in FIG. 4, which will be described later. The program and the data are read out to the RAM 10d when necessary. Then, the CPU 10b executes the program. A part or the whole of the program and the data may be stored in the ROM 10e. Alternatively, a part or the whole of the functions may be realized by the control circuit 10h.

The printing device 10f is a device for printing images on a paper sheet based on image data obtained by the scanner 10a or image data transmitted from other devices. For printing, four colors of toner including yellow, magenta, cyan and black are used.

The communication interface (network interface) 10g is an interface for communicating with other devices. As the communication interface 10g, an NIC (Network Interface Card), a modem, an NCU (Network Control Unit) or the like is used. Note that the communication interface 10g performs transmission of electronic mail, transmission and reception of data via a telephone circuit, a process about a protocol of communication for a facsimile (FAX) or the like, modulation and demodulation for FAX transmission and reception, and the like.

The control circuit 10h is a circuit for controlling devices including the scanner 10a, the hard disk 10c, the printing device 10f, the communication interface 10g and the operation panel 10k.

The operation panel 10k is an input device (interface) for a user to conduct various setting on the image processing device 1 or to give a command such as print to the same.

Figure 2:
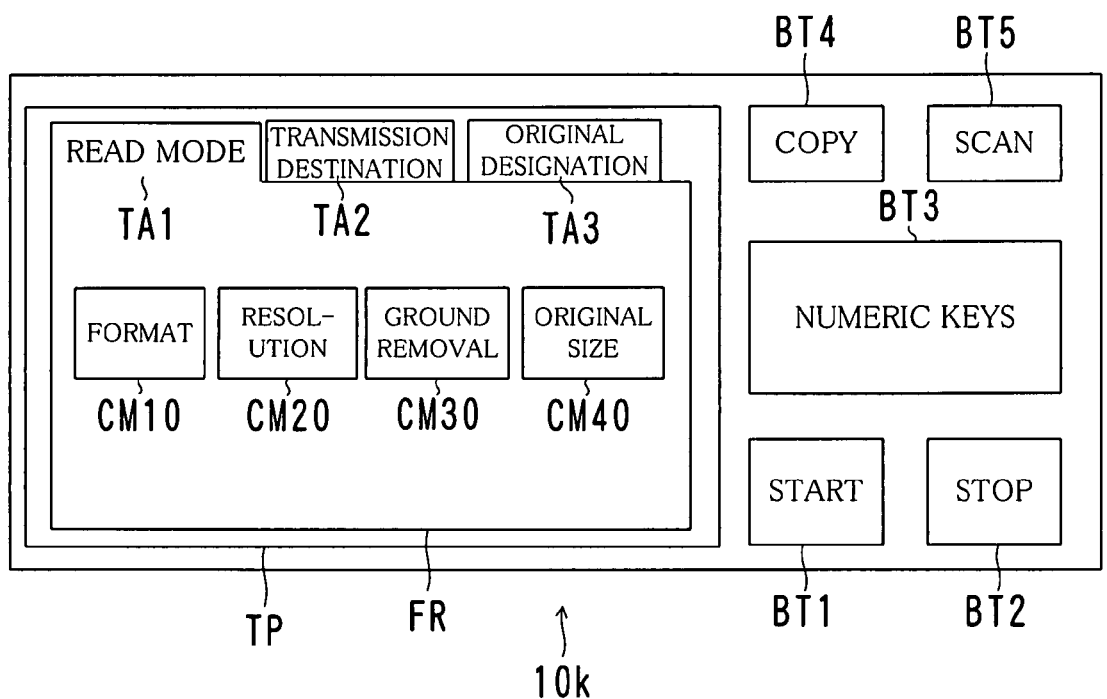
FIG. 2 is a diagram showing an example of an operation panel.

As shown in FIG. 2, the operation panel 10k is equipped with a start button BT1, a stop button BT2, a numeric keys BT3, a copy button BT4, a scan button BT5 and a display device TP.

In FIG. 2, the display device TP is a touch panel type liquid crystal display, and it displays a screen for the user to conduct various setting or a message to the user.

For example, the user can operate the screen displayed on the display device TP so as to select an item for setting about scanning (a scan set item) and conduct setting for it. In addition, the user can select a format of an image file or input a destination of electronic mail or FAX.

The start button BT1 is a button for starting various processes including the copy and the scan.

The stop button BT2 is a button for stopping a process during execution.

The numeric keys BT3 includes a plurality of buttons for inputting the number of copies, a destination of FAX or the like.

The copy button BT4 is a button for starting to conduct setting about the copy. When this button is pushed, a screen for copy setting is displayed on the display device TP.

The scan button BT5 is a button for starting to conduct setting for reading (scanning) by the scanner 10a. When the user pushes this button, a setting screen FR is displayed on the display device TP as shown in FIG. 2.

The setting screen FR includes tabs TA1, TA2 and TA3 corresponding to scan set items, and screen buttons CM10, CM20, CM30 and CM40. In the following description, the tabs TA1, TA2 and TA3 may be referred to as "tab TA" collectively, and the screen buttons CM10, CM20, CM30 and CM40 may be referred to as "screen button CM" collectively. As to other reference symbols too, serial numbers attached to the symbols may be omitted similarly.

Figure 3:
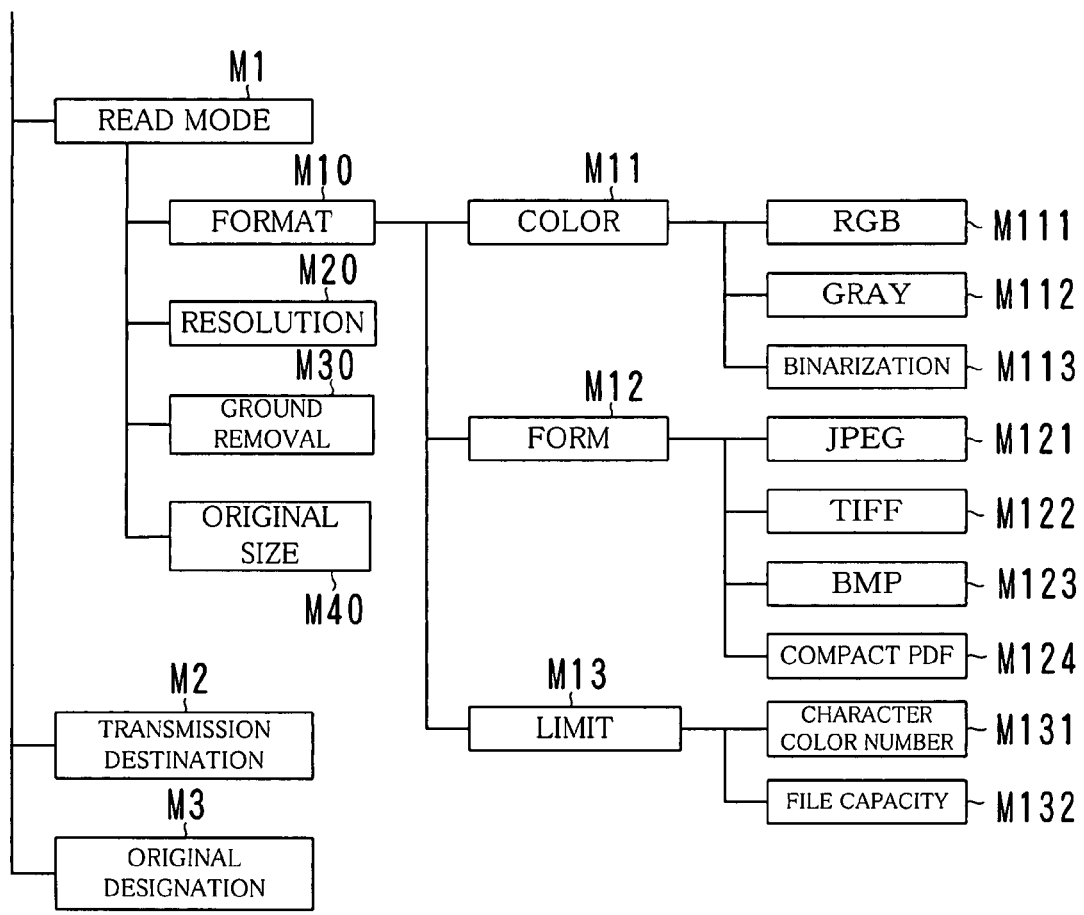
FIG. 3 is a diagram for explaining set items for a scanner.

As shown in FIG. 3, the scan set items in this embodiment has a hierarchical structure of four layers. In the example shown in FIG. 2, the tabs TA1, TA2 and TA3 correspond respectively to the scan set items M1, M2 and M3 of the first layer shown in FIG. 3. In addition, the screen buttons CM10, CM20, CM30 and CM40 correspond respectively to the scan set items M10, M20, M30 and M40 of the second layer.

When the screen button CM is selected on the setting screen FR shown in FIG. 2, scan set items M on the lower layer of the scan set item M corresponding to the button is displayed on the setting screen FR.

For setting the scan, the user pursues the layers in turn by using the setting screen FR, so that scan set items M (M111-M113, M121-M124 or M131-M132) on the fourth layer to be set are displayed. Then, parameters or the like on the scan set item M are set by using the numeric keys BT3 or the like.

Recently, MFPs have moved from types of monochrome image processing to types capable of color image processing. In addition, the MFP may be used for a purpose of transmitting electronic mail directly from the MFP with image data of a scanned original, which is attached to the electronic mail. In this case, if a necessary condition is changed in accordance with a type of the original to be transmitted or the number of original sheets, a need of a user of the MFP also changes variously as follows.

Since the number of original sheets to be transmitted is large, it is preferable that a file to be generated has a size as small as possible insofar that characters can be read.

If colors of characters are changed, meaning of an original is also changed. Therefore, the colors of the characters should be reproduced as precisely as possible.

It is preferable to generate a file having a size as small as possible without decreasing speed of printing so much.

Since a process of OCR (Optical Character Reader) is intended, it is sufficient that characters can be recognized.

It is preferable to maintain a high resolution of not only characters but also the background.

In order to satisfy the needs described above, it is preferable that a user can change setting of the MFP in accordance with a type of an original or the number of original sheets. Setting items to be changed may include the following items.

(a) Resolution of scanning (area discrimination resolution)
(b) Resolution of background layer
(c) Compression intensity of background layer
(d) Presence or absence of background layer
(e) Resolution of character layer
(f) Limit of numbers of character colors on character layer
(g) Integration level of character Hereinafter, a process about the above-mentioned (f) will be described in detail particularly in this embodiment.

[Functional Structure of Image Processing Device]

Next, processes of portions of the image processing device 1 will be described with reference to FIG. 4 and others.

As shown in FIG. 4, the image processing device 1 is made up of a file storage portion 11, an image data obtaining portion 12, a preprocess portion 13, an area process portion 14, an integration process portion 15, a lossless compression portion 16, a resolution reducing portion 17, a lossy compression portion 18 and a file generating portion 19.

The file storage portion 11 stores electronic files having a format of PDF or the like generated by the file generating portion 19.

The image data obtaining portion 12 obtains original image data DG that are image data of an original read by the scanner 10a. The original image data DG are outputted by the scanner 10a in a format of TIFF, JPEG, bitmap or the like. Note that "image data" and "original image data" may be referred to as "image" and "original image" simply by omitting "data" in the following description. The same applies to other image data that will be described later.

The preprocess portion 13 performs preprocessing for a process performed by the area process portion 14 described below. Specifically, it performs processes of conversion of a format of the original image DG, conversion of a resolution, removal of the ground, and the like.

The area process portion 14 extracts a specific area from the original image DGb on which the preprocess portion 13 has performed the preprocessing, and it performs a process (area discrimination process) in accordance with an attribution of an image included in the area. The area discrimination process is a process of discriminating which type the area is; a drawing area about drawings, a photograph area about photographs, a table area about tables, a ground area of only the ground, or a character area (text area) about characters.

Further, it determines whether or not the area contains a character (character determination process) based on a result of the area discrimination process. Then it binarizes an image of the area containing a character to make binary data and discriminates a color of the character (binarizing and character color discriminating process). Hereinafter, each of the area discrimination process (drawing, photograph or ground discriminating process), the character determination process, and binarizing and character color discriminating process performed by the area process portion 14 will be described more in detail with reference to FIG. 5.

Figure 5:
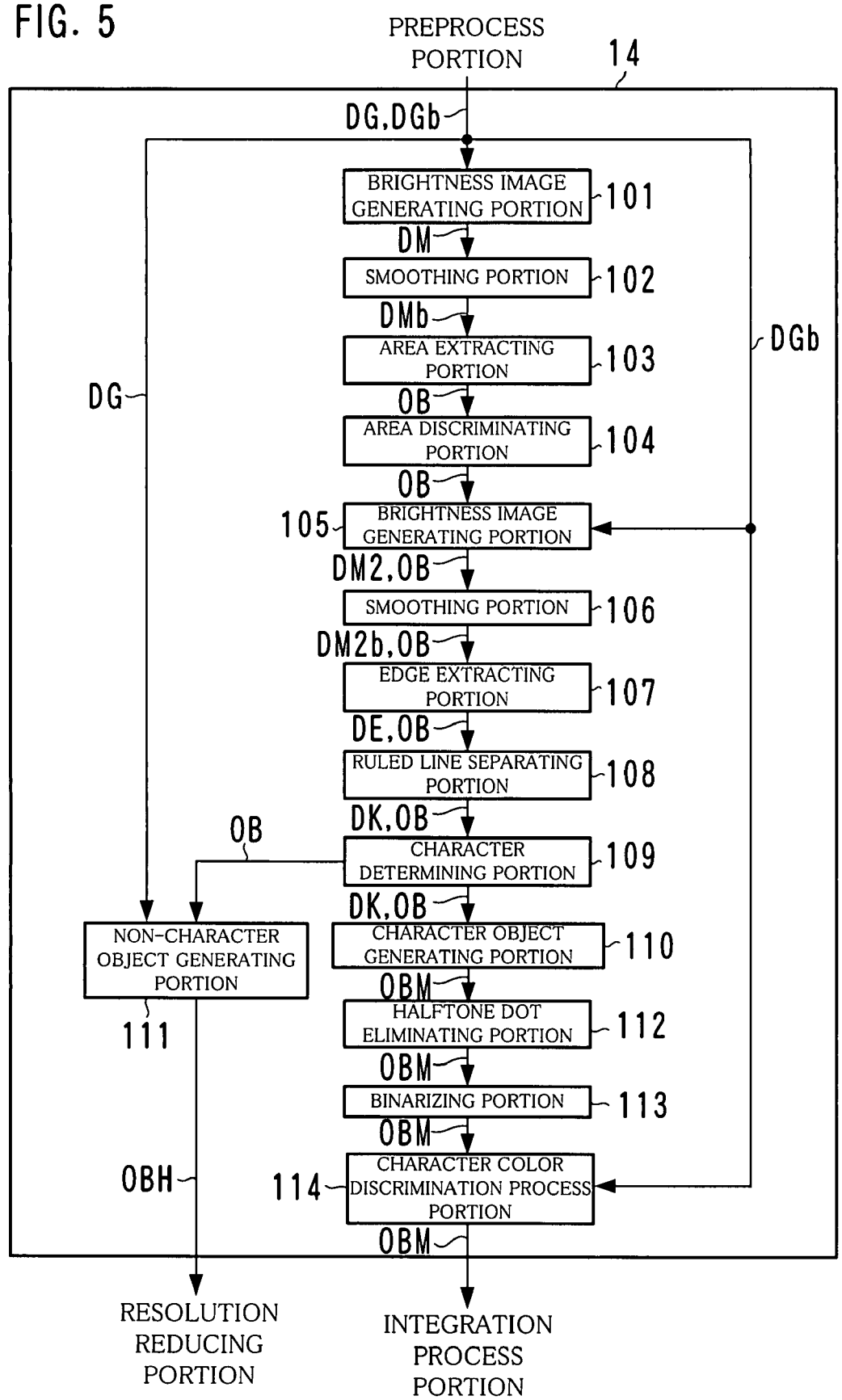
FIG. 5 is a diagram showing an example of a structure of an area process portion.

As shown in FIG. 5, the area process portion 14 is made up of a brightness image generating portion 101, a smoothing portion 102, an area extracting portion 103, an area discriminating portion 104, a brightness image generating portion 105, a smoothing portion 106, an edge extracting portion 107, a ruled line separating portion 108, a character determining portion 109, a character object generating portion 110, a non-character object generating portion 111, a halftone dot eliminating portion 112, a binarizing portion 113, and a character color discrimination process portion 114 and the like.

Here, processes of the brightness image generating portion 101, the smoothing portion 102, the area extracting portion 103 and the area discriminating portion 104 correspond to the "area discrimination process" described above. In addition, processes of the brightness image generating portion 105, the smoothing portion 106, the edge extracting portion 107, the ruled line separating portion 108, the character determining portion 109, the character object generating portion 110 and the non-character object generating portion 111 correspond to the "character determination process". Furthermore, processes of the halftone dot eliminating portion 112, the binarizing portion 113 and the character color discrimination process portion 114 correspond to the "binarizing and character color discriminating process".

Figure 6:
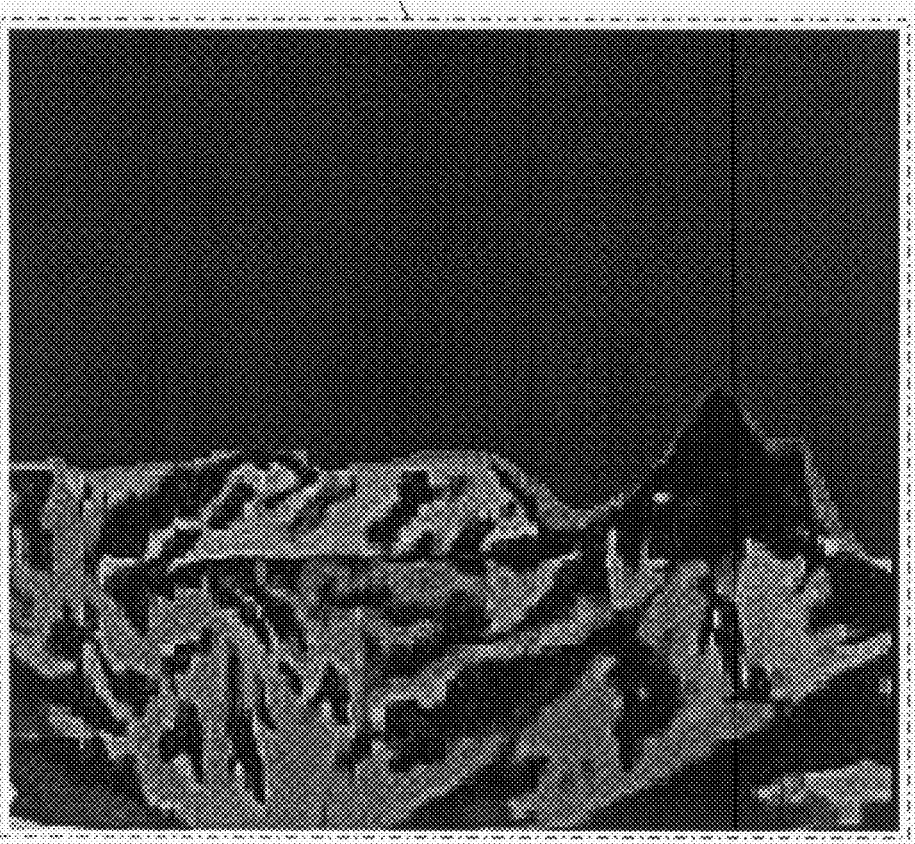
FIG. 6 is a diagram showing an example of an original image and a brightness original image.

In FIG. 5, the brightness image generating portion 101 calculates brightness values from the original image DGb and generates an image (brightness image) expressed by the brightness values. Thus, a brightness original image DM that is a brightness image corresponding to the original image DG is generated as shown in FIG. 6. Note that the "brightness image corresponding to the original image DG" means a brightness image showing contents corresponding to the original image DG in an area having the same size as that of the original image DG as shown in the example of FIG. 6.

Moreover, in this embodiment, a brightness original image DM having eight-bit gradation is generated from a full color original image DGb having 24-bit gradation of R (red), G (green) and B (blue) primary colors (hereinafter referred to as "R, G and B colors").

Furthermore, in this embodiment, considering accuracy of discrimination performed by the area discrimination process and a load of the operation, a brightness image is a main target of the process performed by the area process portion 14.

The smoothing portion 102 performs a smoothing process on the brightness original image DM generated by the brightness image generating portion 101. The smoothing process removes noises, so that detection error of information can be reduced in the area discrimination process.

The area extracting portion (area separating portion) 103 binarizes the brightness original image DMb after the smoothing process to make binary data and then detects continuous pixels, except for white, forming a character, a photograph or a graphic from the binary data. Then, it extracts (detects) a rectangular area (block) enclosing a group of pixels that are the continuous pixels. Alternatively, groups of pixels being apart by a predetermined distance are regarded as one group of pixels, and a rectangular area enclosing the group of pixels is extracted. Thus, a rectangular area of a character, a word, a drawing or a photograph is extracted as shown by a dashed dotted line in FIG. 6.

Furthermore, the extracted rectangular areas are labeled so as to obtain positions of the rectangular areas (hereinafter, it may be referred to as a "block position"). Note that the binarizing process and the labeling process are performed for the area discriminating portion 104, which will be described next, to process and discriminate for each of the continuous rectangular areas of a character, a drawing or a photograph.

Then, object data (object) are generated, which indicate information about the rectangular area, such as a size of the rectangular area (hereinafter it may be referred to as a "block size") and the block position. Hereinafter, this object may be referred to as an "object OB". Alternatively, objects may be referred to "object OB1", "object OB2", and the like with serial numbers suffixed to a symbol of the object OB by respectively differentiating from one another. Other reference symbols may also be referred to with serial numbers suffixed to the symbols similarly. In addition, when the rectangular area is illustrated, the rectangular area may be represented by the object OB corresponding to the area.

In this embodiment, the block position of the character object OB is indicated by coordinates in the brightness original image DM of the upper left pixel within the rectangular area where the origin of the coordinates is upper left end of the brightness original image DM. The block size is indicated by the number of pixels in the vertical direction and the number of pixels in the horizontal direction of the rectangular area.

By the process described above, the objects OB1, OB2, . . . , OB7 are obtained about the rectangular areas as shown in FIG. 6.

The area discriminating portion 104 extracts a part corresponding to the rectangular area of the object OB in the brightness original image DM and discriminates which type the rectangular area is in accordance with characteristics of the brightness image shown in the part; a drawing area, a photograph area, a table area, a ground area or a character area. In other words, the rectangular area is classified into one of the above types. Then, data indicating a result of the discrimination are added to the object OB that was a target of the discrimination.

In FIG. 6, the rectangular area as shown as an object OB5 is the drawing area for example. The rectangular area as shown as the object OB7 is the photograph area. The rectangular areas as shown as the objects OB1, OB2, OB3, OB4 and OB6 are the character areas. In addition, if there is a rectangular area of only the ground, it is the ground area.

Hereinafter, the drawing area, the photograph area, the table area and the ground area may be collectively referred to as a "background area".

The brightness image generating portion 105 calculates brightness values from the original image DGb so as to generate a brightness original image DM2.

The smoothing portion 106 performs the smoothing process on the brightness original image DM2.

Note that the brightness image generating portion 105 and the smoothing portion 106 use appropriate parameters in each process considering a succeeding process performed by the character determining portion 109.

The edge extracting portion 107 extracts edge portions from the brightness original image DM2$b$ on which the smoothing portion 106 has performed the smoothing process so as to generate an edge image that is an image expressed by the edge portions. In order to detect a character in an area having high brightness or a reversal character, edge portions are extracted without binarizing process here. Thus, an edge original image DE that is an edge image corresponding to the original image DG is generated.

The ruled line separating portion 108 performs a process of separating characters from ruled lines for the entire edge original image DE so as to generate a ruled line separated image. Thus, a ruled line separated original image DK that is a ruled line separated image corresponding to the original image DG is generated. When the characters are separated from the ruled lines, determination accuracy in the character determination process can be improved.

The character determining portion 109 determines whether or not the object OB contains a character, i.e., whether or not a character is indicated in the ruled line separated image of the part corresponding to the object OB in the ruled line separated original image DK for each of the objects OB.

For example, in the case of the object OB1 shown in FIG. 6, a character "T" is indicated in the image of the part corresponding to the object OB1 in the original image DG, so it is determined that a character is contained. In addition, the character determining portion 109 performs determination of the character if the photograph area or the like further contains a character.

Note that different methods of determination are used in the character determining portion 109 depending on whether the area discriminating portion 104 has determined the rectangular area of the object OB to be the character area or other area.

The character object generating portion 110 performs a process for generating a character object OBM as follows, which is an object data of the rectangular area of the object OB that was determined to indicate a character.

The block position and the block size of the object OB are obtained from the object OB that was determined to indicate a character. In addition, a ruled line separated image of the part corresponding to the object OB in the ruled line separated original image DK is obtained. Then, a character object OBM indicating the obtained ruled line separated image, block position and block size is generated.

The non-character object generating portion 111 performs a process for generating a non-character object OBH as follows, which is object data of the rectangular area of the object OB that was not determined to indicate a character.

The block position and the block size of the object OB are obtained from the object OB that was not determined to indicate a character. In addition, an image (full color image) of the part corresponding to the object OB in the original image DG is obtained. Then, a non-character object OBH indicating the obtained full color image, block position and block size is generated.

Note that it is possible to use not the original image DG but an original image DGb or the brightness image DM for generating the non-character object OBH. In other words, it is possible to obtain an image of the part corresponding to the object OB in the original image DGb or the brightness image DM, and to generate the non-character object OBH indicating the obtained block position, block size and the image.

Hereinafter, the images including the ruled line separated image and the full color image indicated in the character object OBM and the non-character object OBH may be collectively referred to as the "object image".

The halftone dot eliminating portion 112 performs a process of halftone dot elimination on the object image (ruled line separated image) of each character object OBM.

The binarizing portion 113 binarizes the object image of the character object OBM after the halftone dot elimination to make binary data. Thus, a character part included in the object image is separated from a background part. Hereinafter, an object image on which the halftone dot elimination process and the binary process have been performed may be referred to as an "object binary image GN" in particular.

By performing the halftone dot elimination process prior to the binary process, it is possible to reduce noises that may be generated when the halftone dots of the background part of a character is binarized to be binary data. In addition, the binary process can reduce quantity of data of the character object OBM.

Figure 7:
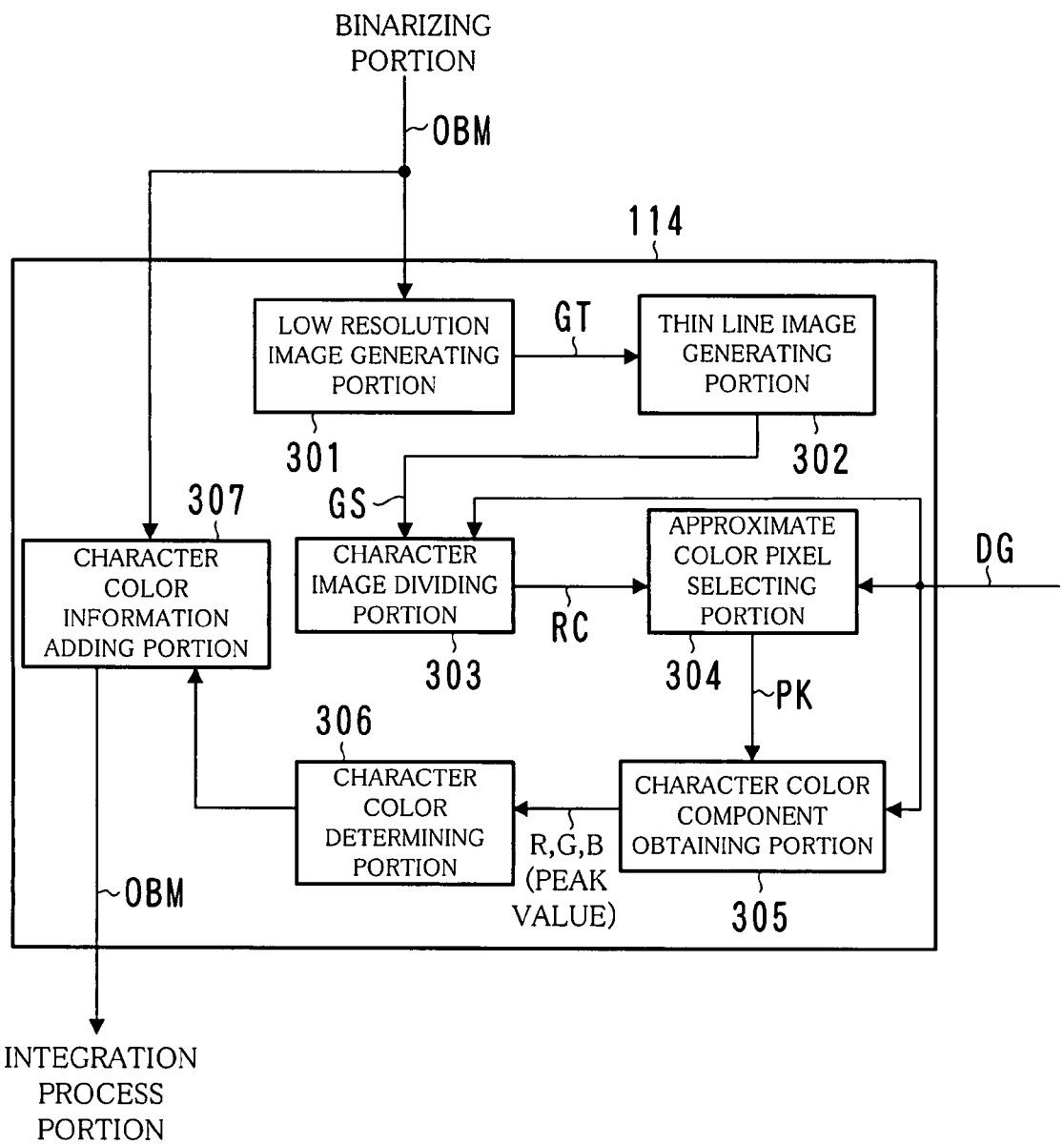
FIG. 7 is a diagram showing an example of a structure of a character color decision process portion.

As shown in FIG. 7, the character color discrimination process portion 114 is made up of a low resolution image generating portion 301, a thin line image generating portion 302, a character image dividing portion 303, an approximate color pixel selecting portion 304, a character color component obtaining portion 305, a character color determining portion 306, a character color information adding portion 307 and the like. The character color discrimination process portion 114 discriminates a character color on the original (hereinafter referred to as an "original character color"). In this embodiment, the original character color is discriminated for each character object OBM, and a typical color that is one original character color for the character object OBM is determined. Here, contents of the process of discriminating the original character color will be described with an example of the case where a character object OBMx of a character group "255255" as shown in FIG. 8 is a process target.

Figure 8:
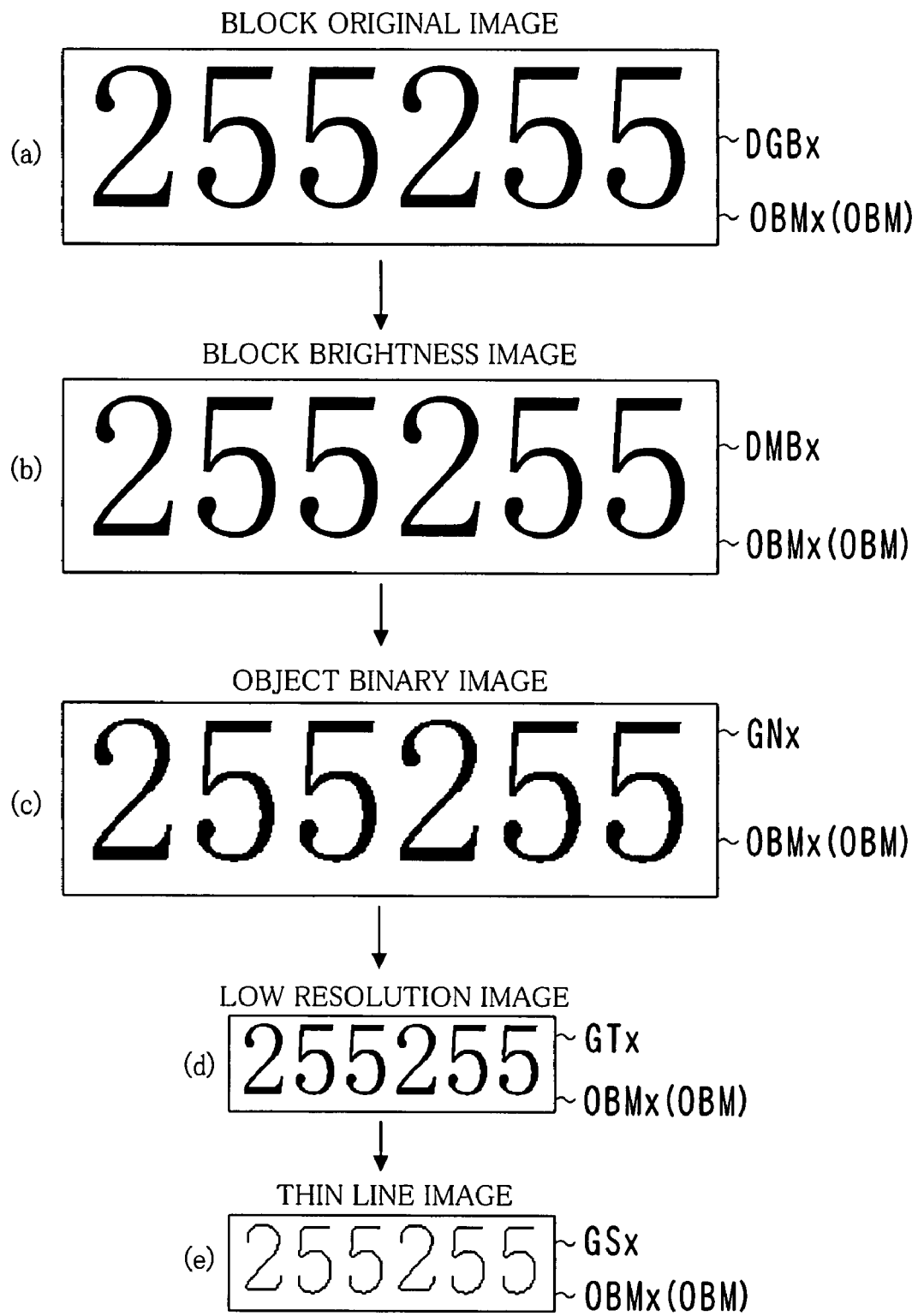
FIG. 8 is a diagram for explaining an example of a method for generating a thin line image.

Section (a) in FIG. 8 shows an image of a part corresponding to the character object OBMx in the original image DG (hereinafter referred to as a "block original image DGBx").

Section (b) in FIG. 8 shows an image of a part corresponding to the character object OBMx in the brightness original image DM (hereinafter referred to as a "block brightness image DMBx"). Section (c) in FIG. 8 shows an object binary image GNx indicated by the character object OBMx.

The low resolution image generating portion 301 shown in FIG. 7 generates a low resolution image GTx as shown in section (d) in FIG. 8 by reducing the resolution of the object binary image GNx in the character object OBMx. In this embodiment, it is supposed that the block original image DGBx, the block brightness image DMBX and the object binary image GNx have a resolution of 300 dpi and that the low resolution image generating portion 301 generates the low resolution image GTx having a resolution of 75 dpi.

Figure 9:
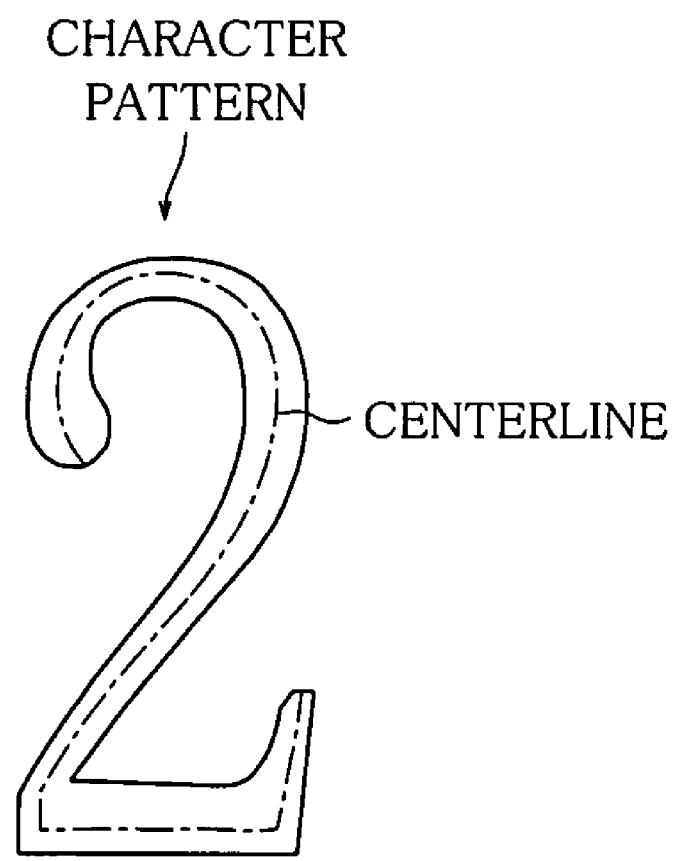
FIG. 9 is a diagram showing an example of a position of a centerline of a character pattern.

The thin line image generating portion 302 generates a thin line image GSx as shown in section (e) in FIG. 8 by performing a known thinning process on the low resolution image GTx. More specifically, it generates the low resolution image GTx by detecting a centerline of a line diagram having a thickness more than 1 pixel indicated in the low resolution image GTx. For example, from the character pattern of "2", the centerline as shown in FIG. 9 is detected. In this embodiment, the thin line image GSx showing a thin line having a thickness of one pixel is generated. Note that the resolution of the thin line image GSx is the same as the resolution of the low resolution image GTx, which is 75 dpi. By the process of the thin line image generating portion 302, groups of pixels (area) located on the centerline of the character pattern and its vicinity can be found.

Figure 10:
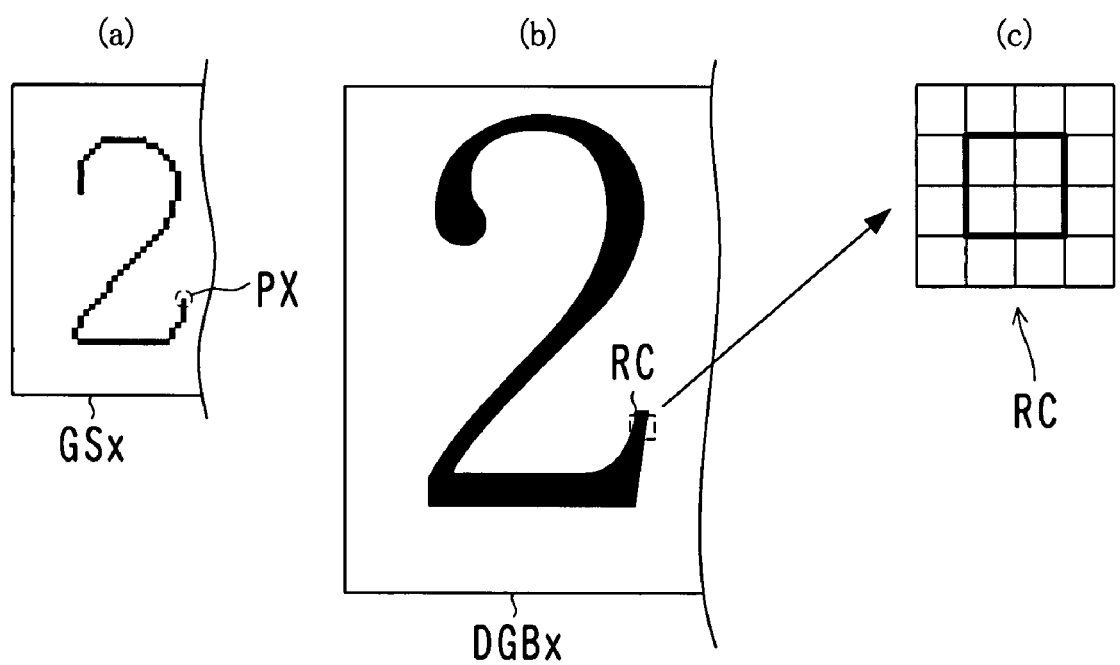
FIG. 10 is a diagram for explaining an example of a method for dividing an area of the centerline and its vicinity of the character pattern into a plurality of character color candidate areas.

The character image dividing portion 303 divides the centerline and its vicinity of the character pattern indicated (included) in the block original image DGBx based on the thin line image GSx into a plurality of character color candidate areas RC (see FIG. 10). The process of dividing into the character color candidate areas RC is performed by the following method, for example.

One pixel on a thin line of the thin line image GSx corresponds to a plurality of pixels among pixels that constitute a character in the block original image DGBx. More specifically, one pixel PX on the thin line in the thin line image GSx shown by a circular dotted line in section (a) of FIG. 10, for example, corresponds to a plurality of pixels on the character line of the original block original image DGBx shown by a rectangular dotted line in section (b) of FIG. 10. The character image dividing portion 303 extracts a group of these pixels as a character color candidate area RC. In this embodiment, the character color candidate area RC of 4×4 pixels shown in section (c) of FIG. 10 is extracted from a relationship between resolutions of the thin line image GSx and the block original image DGBx. Similarly, a centerline of the character pattern in the block original image DGBx and its vicinity can be divided into a plurality of character color candidate areas RC by extracting a group of pixels corresponding to the other pixels on the thin line. By the process of the character image dividing portion 303, a plurality of character color candidate areas RC are extracted.

Figure 11:
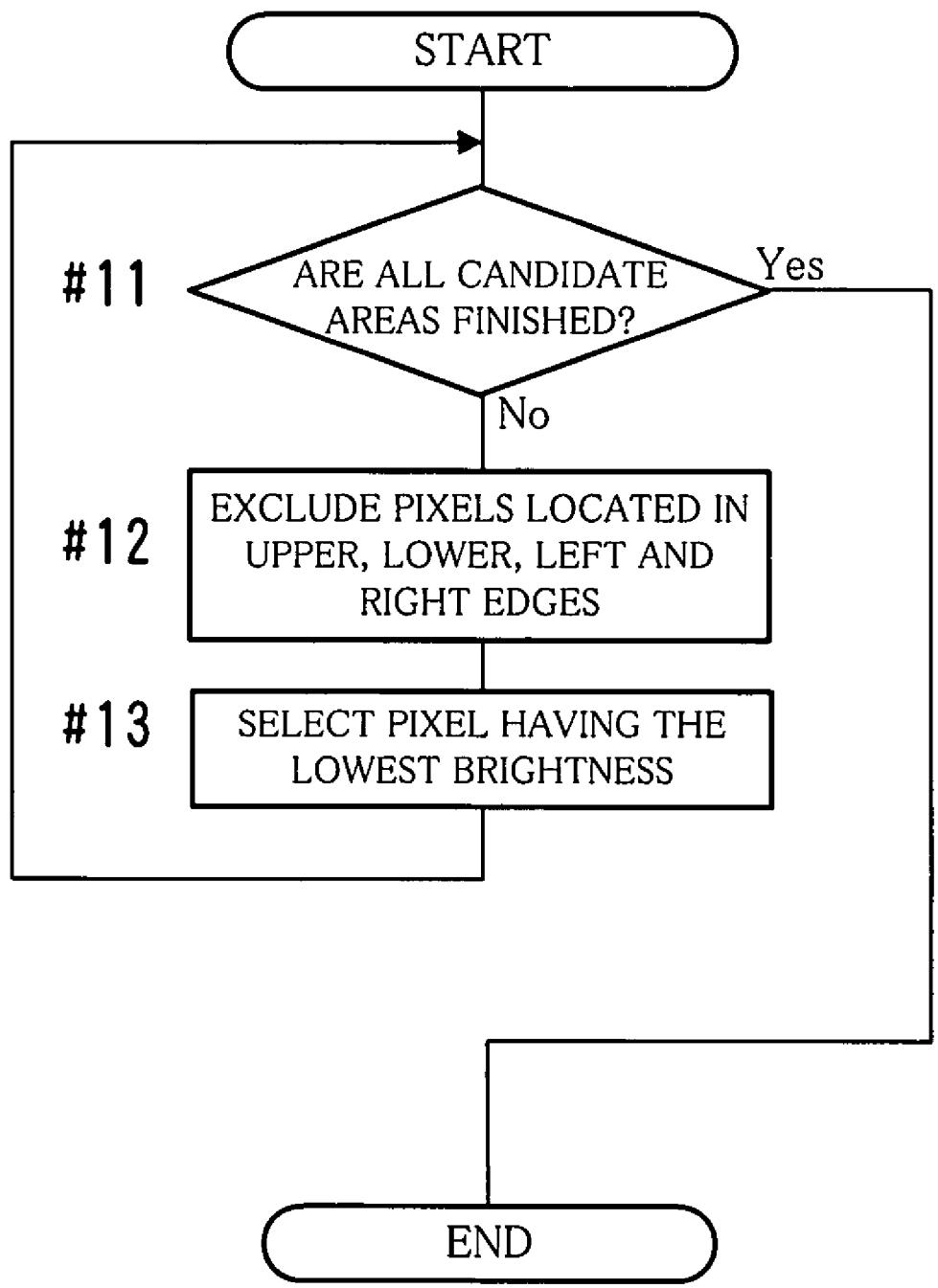
FIG. 11 is a flowchart for explaining an example of a flow of a process for selecting an approximate color pixel.

The approximate color pixel selecting portion 304 selects a pixel that is considered to have a color closest to the original character color (hereinafter referred to as an "approximate color pixel PK") from each of the character color candidate areas RC obtained by the character image dividing portion 303 in a procedure as shown in FIG. 11.

One character color candidate area RC is noted, and pixels located in the upper, the lower, the left and the right edges in the 4×4 pixels constituting the character color candidate area RC (for example, twelve pixels located outside the thick line frame in section (c) of FIG. 10) are excluded from candidates (#12 in FIG. 11). It is because those pixels are closer to the character background image than the pixels located inside the thick line frame, and so there is a high possibility of occurrence of a color blur and reliability is low.

Brightness values of the pixels that have remained without being excluded, which are 2×2 pixels located inside the thick line frame in section (c) of FIG. 10, are calculated. Then, a pixel having the lowest brightness (i.e., a pixel having the highest density) is selected as a pixel indicating a color that is closest to the original character color, i.e., as the approximate color pixel PK (#13).

As to other character color candidate areas RC, the process of the steps #12 and #13 is performed similarly so that the approximate color pixel PK is selected.

By the process described above, many approximate color pixels PK are selected for one character object OBMx. Specifically, the approximate color pixels PK are selected in the number that is the same as the number of pixels constituting the thin line of the thin line image GSx (see section (e) in FIG. 8) of the character object OBMx.

Figure 12A:
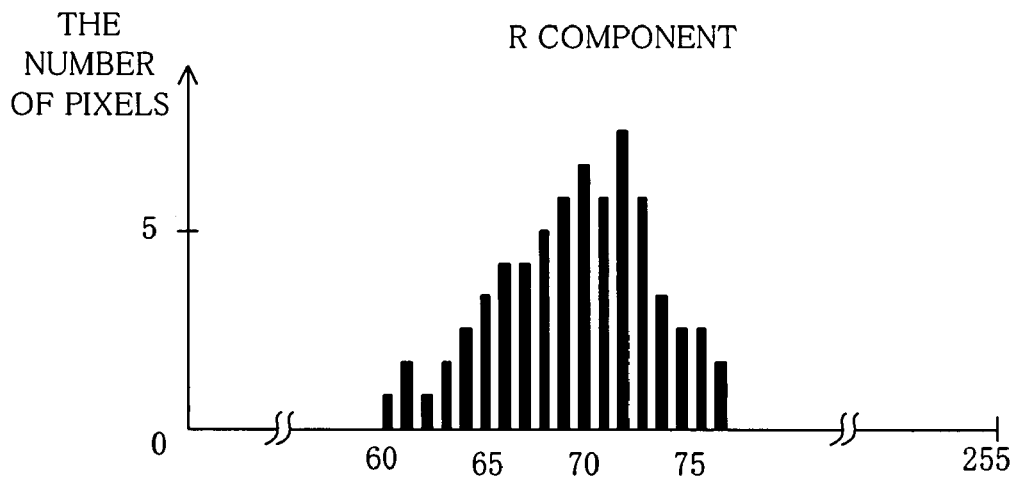
FIGS. 12A-12C are drawings showing examples of distributions of gradation of primary colors.
Figure 12B:
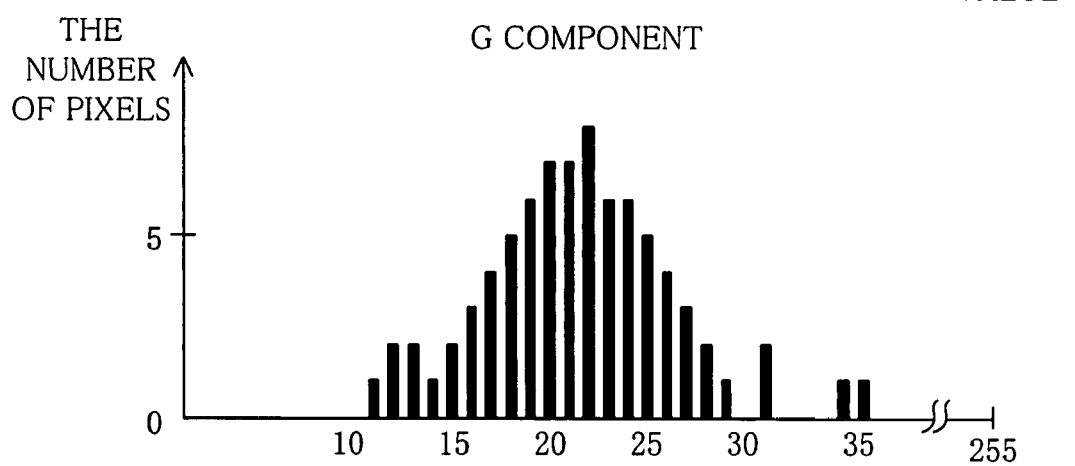
Figure 12C:
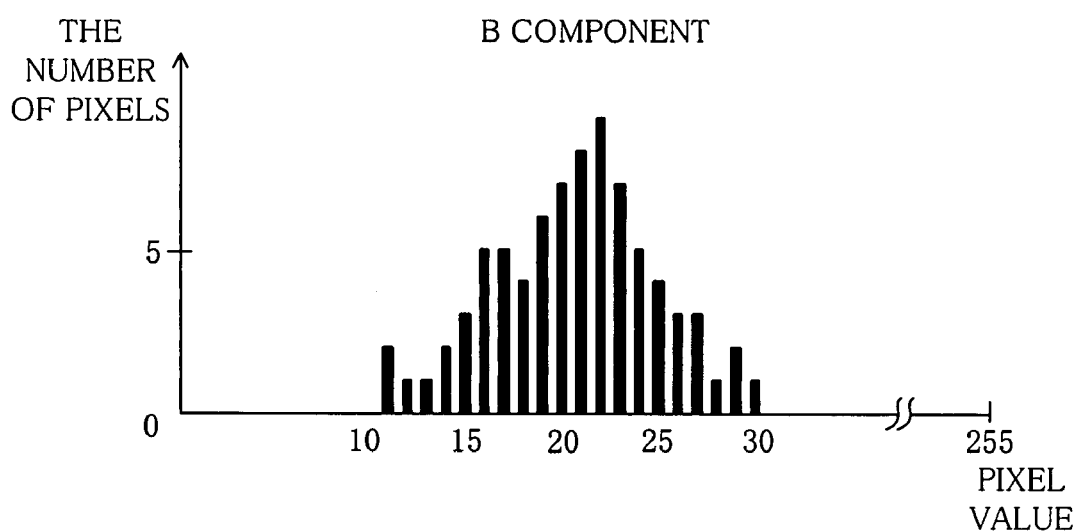

The character color component obtaining portion 305 shown in FIG. 7 obtains pixel values (density values) that are values of gradation of R, G and B primary colors of the approximate color pixels PK for the character indicated in the object image of the character object OBMx (character included in the character object OBMx) for each of the approximate color pixels PK selected by the approximate color pixel selecting portion 304. The pixel value can be obtained by searching a part corresponding to the character object OBMx in the original image DG and by referring to a pixel value at the position of the approximate color pixel PK in the character object OBMx. The obtained values of gradation of the primary colors have distributions as histograms shown in FIGS. 12A-12C, for example.

The character color determining portion 306 determines a color of a character included in the character object OBMx based on the distribution of gradation values of the primary colors obtained by the character color component obtaining portion 305 by using the method as follows.

A peak value is determined for each of the distributions of the gradation values of each primary color obtained by the character color component obtaining portion 305. This is determined by a known method. For example, a pixel value of the largest number of pixels may be selected as the peak value, or a known calculation method may be used for determining it. A color that is reproduced by the peak values of the R, G and B determined as described above is adopted as a color of the character included in the character object OBMx. Then, this is determined to be a color of the character included in the character object OBMx.

Thus, a typical color of the character object OBMx is determined.

The character color information adding portion 307 adds data indicating the typical color determined by the character color determining portion 306 to the character object OBMx. In other words, the character object OBMx includes the object binary image GN, the block position, the data indicating the block size and the data indicating the typical color at this time point.

With reference to FIG. 4 again, the integration process portion 15 obtains the character objects OBM from the area process portion 14 and integrates some of the obtained character objects OBM that have a relationship satisfying a predetermined condition into one character object OBM. Thus, the number of character objects OBM is reduced.

Here, with reference to FIGS. 13 and 14, the integration of character objects OBM will be described. Note that character objects OBM of characters "A", "B", "C", "D", "E" and the like will be exemplified for the description here.

Figure 13:
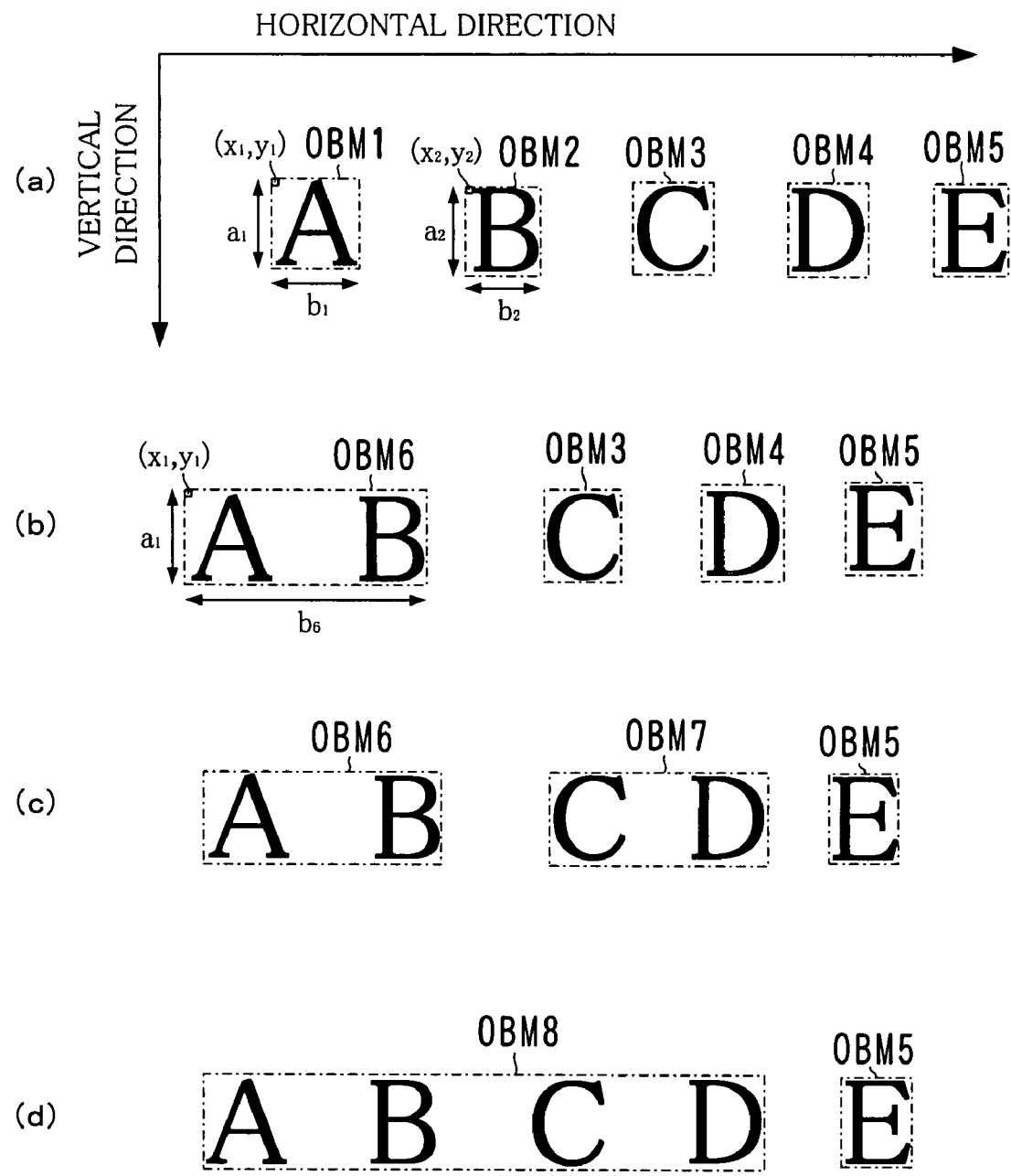
FIG. 13 is a diagram showing a first example for explaining integration of character objects.

FIG. 13 shows character objects OBM1, OBM2, OBM3, OBM4 and OBM5 arranged in the horizontal direction (row direction). In FIG. 13, block positions of the objects OBM1, OBM2, . . . are respectively expressed by $(x_1, y_1)$, $(x_2, y_2)$, . . . when the upper left end of the original image DG is the origin, the coordinate of a pixel in the horizontal direction is the X coordinate, and the coordinate of the pixel in the vertical direction is the Y coordinate. In addition, the block sizes of them are respectively expressed by $(a_1, b_1)$, $(a_2, b_2)$, . . . when the vertical length and the horizontal length are expressed by "(vertical length, horizontal length)".

First, the case where the integration process portion 15 integrates the character object OBM1 and the character object OBM2 will be considered.

The integration process portion 15 determines a block position $(x_1, y_1)$ and a block size $(a_1, b_6)$ of a rectangular area that includes the character object OBM1 and the character object OBM2 based on a block position $(x_1, y_1)$ of the character object OBM1, a block position $(x_2, y_2)$ of the character object OBM2, a block size $(a_1, b_1)$ of the character object OBM1 and a block size $(a_2, b_2)$ of the character object OBM2.

Thus, the rectangular area including the characters "A" and "B" as shown in section (b) of FIG. 13 is defined.

In addition, an average value of the typical color indicated in the character objects OBM1 and OBM2 is determined by a weighted average process. The method of determining the average value will be described later in detail.

Then, the character object OBM6 indicating an image of the defined rectangular area, the block coordinates $(x_1, y_1)$, the block size $(a_1, b_6)$ and the determined average value is generated. More specifically, the object binary images GN included in each of the character object OBM1 and character object OBM2 are integrated, and data indicating the block position, the block size and the typical color are integrated so that a new character object OBM6 is generated.

Thus, the number of character objects OBM is reduced by one, and four of the character objects OBM6, OBM3, OBM4 and OBM5 remain as shown in section (b) of FIG. 13.

After that, the integration process portion 15 further performs the integration process on two character objects OBM that satisfy the predetermined condition if there are such character objects OBM among the character objects OBM that have remained. For example, if the relationship between the character object OBM3 and the character object OBM4 satisfies the predetermined condition, they are integrated next so that a new character object OBM7 is generated.

Then, as shown in section (c) of FIG. 13, the character objects OBM5, OBM6 and OBM7 remain. In addition, if the character object OBM6 and the character object OBM7 are integrated, the character objects OBM5 and OBM8 remain as shown in section (d) of FIG. 13.

In this way, the integration process portion 15 repeats the integration process on the character objects OBM that have remained after the integration process, so as to reduce the number of character objects OBM.

In FIG. 13, the case where the character objects OBM are arranged in the horizontal direction is shown. In contrast, FIG. 14 shows the case where they are arranged in the vertical direction (column direction), too.

Figure 14:
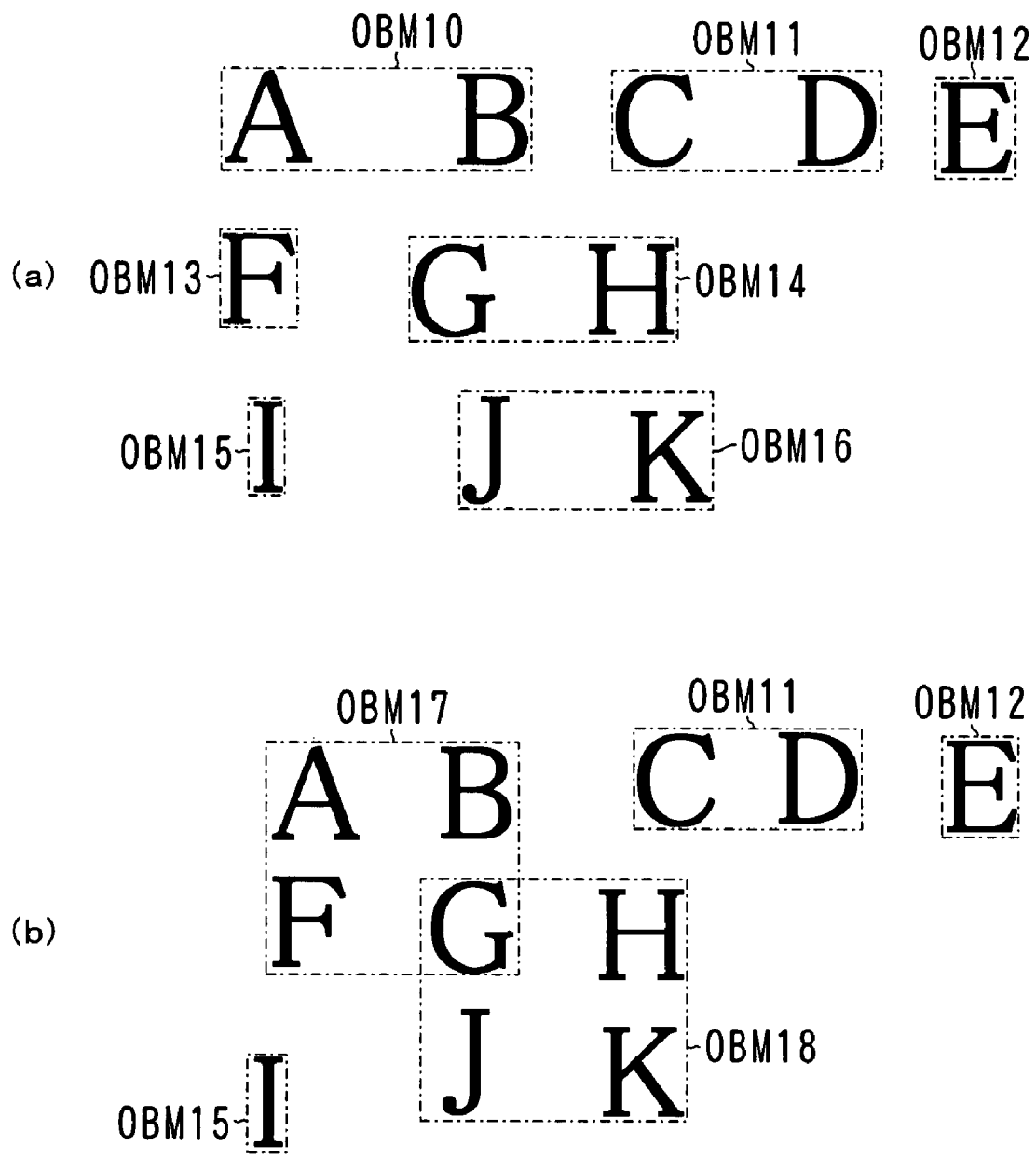
FIG. 14 is a diagram showing a second example for explaining the integration of character objects.

In section (a) of FIG. 14, the character objects OBM10, OBM11, OBM12, OBM13, OBM14, OBM15 and OBM16 are shown.

Here, if the character object OBM14 and the character object OBM16 are integrated after integrating the character object OBM10 and the character object OBM13, character objects OBM11, OBM12, OBM15, OBM17 and OBM18 remain after that as shown in section (b) of FIG. 14.

In this case, as shown in section (b) of FIG. 14, there is an overlapping area between the character object OBM17 including characters "A", "B" and "F" and the character object OBM18 including characters "G", "H", "J" and "K".

As understood from this example, it is possible to perform the integration process such that an overlapping character objects OBM are generated after the integration. In other words, it can be considered that a layer is formed for each character object OBM, which is positioned on the layer. The same applies to the non-character object.

Therefore, the character object OBM can be called a "character layer", and the non-character object OBH can be called a "non-character layer" or a "background layer" or the like.

The integration process portion 15 performs the integration process described above for each row in the horizontal direction and further for each column in the vertical direction. As to the character objects OBM that have remained after the process, the integration process is repeated under a predetermined condition. The procedure of this integration process and the condition of the integration process and the like will be described later in detain in [Structure of integration process portion].

The lossless compression portion 16 obtains the character object OBM that has remained after the integration process by the integration process portion 15 and compresses (in a reversible manner) the object binary image GN indicated in the character object OBM by a format of lossless (reversible) compression. Then, the character object OBM including the compressed object image is outputted. Note that MMR is used as the format of lossless compression in this embodiment.

The resolution reducing portion 17 performs a resolution reducing process on the object image indicated in the non-character object OBH.

The lossy compression portion 18 performs a lossy (non-reversible) compression process on the object image of the non-character object OBH after the resolution reducing process, and the non-character object OBH including the compressed object image is outputted. Note that JPEG format is used as a format of the lossy compression in this embodiment.

The file generating portion 19 combines the character object OBM and the non-character object OBH outputted by the lossless compression portion 16 and the lossy compression portion 18 so as to generate a file. A file of compact PDF is generated in this embodiment.

A format of the file generated here can be set in "FORM" of the scan set item M12 shown in FIG. 3. One of the formats corresponding to the lower scan set items M121, M122, M123 and M124 is selected for the setting. "COMPACT PDF" of the scan set item M124 is set as default in this embodiment.

Here, the structure of the compact PDF file will be described with reference to FIG. 15.

Figure 15:
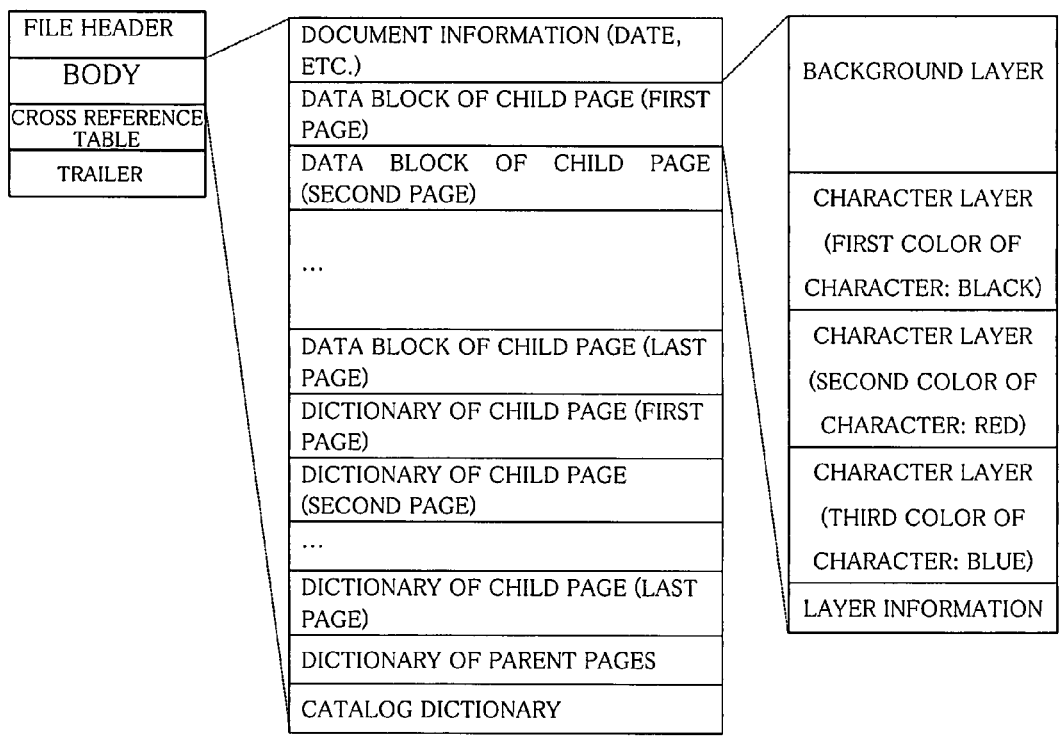
FIG. 15 is a diagram showing an example of a structure of a compact PDF file.

As shown in FIG. 15, the compact PDF file is made up of a file header, a body, a cross reference table, a trailer and the like as general groups.

The file header indicates a version of specification of the compact PDF. The body indicates contents of the documents. The cross reference table indicates information about positions of objects included in the body. The trailer indicates the number of objects, the object number of a catalog dictionary or the like of the compact PDF file.

The body further includes document information, data blocks of child pages, a dictionary of child pages, a dictionary of parent pages and a catalog dictionary. Here, the catalog dictionary indicates the number of the parent page dictionary. The parent page dictionary indicates the number of pages, the number of the child page dictionary or the like. The child page dictionary indicates a format of the data block or the like.

In addition, the data block of each of the child pages is made up of a background layer, a plurality of character layers, layer information and the like.

The background layer stores data generated by the JPEG compression. The character layer stores data generated by the binary process and the MMR compression process. The layer information indicates positions of the background layer and the character layer, an original character color included in the character layer or the like.

[Structure of Integration Process Portion]

Next, the process performed by the integration process portion 15 will be described more in detail with reference to FIG. 16.

In FIG. 16, the integration process portion 15 is made up of a row direction integrating portion 151, a column direction integrating portion 152, a whole integrating portion 153, a second whole integrating portion 154 and the like.

The row direction integrating portion 151 performs a process for integrating character objects OBM in the horizontal direction (row direction integration process) as follows.

First, rows are defined for the whole area corresponding to the original image DG in accordance with a predetermined rule. Then, a character object OBM located at the leftmost on one row is selected as a reference object. Character objects OBM that are located on the same row as the reference object and within a range of a predetermined distance from the reference object are extracted, and a typical color indicated in a character object OBM is compared with a typical color of the reference object in turn from the character object OBM that has a short distance.

Note that the "character objects OBM that are located on the same row as the reference object" are character objects OBM that cross one or more rows crossing the reference object (i.e., that share at least one row with the reference object), for example.

Furthermore, in this embodiment, a distance between two character objects OBM is regarded as the distance between the nearest pixels included in each of them. Therefore, the distance between the two character objects OBM located on the same row can be determined by subtracting the X coordinate of the right end pixel of the left side character object OBM from the X coordinate of the left end pixel of the right side character object OBM. However, if the character objects OBM overlap each other, the distance between them is regarded as "0". Alternatively, a distance between their block positions may be used as the distance between two character objects OBM.

When a character object OBM having a difference between the compared typical colors (a character color difference) that is a preset threshold level or lower is found, the reference object and its character object OBM are integrated. In other words, the reference object and the character object OBM that satisfies the condition of being located within the range of a predetermined distance from the reference object and having a character color difference of a predetermined threshold level or lower are integrated.

Next, the character object OBM generated newly by the integration is regarded as a next reference object for performing the process described above. If there is no character object OBM that satisfies the above-mentioned condition, a character object OBM that is located on the same row as the reference object and neighbors the reference object on the right side is regarded as a next reference object for performing the above-mentioned process. Then, the above-mentioned process is repeated until the rightmost character object OBM on the row becomes the reference object OBM. This process is performed on every defined row.

The column direction integrating portion 152 performs a process on integrating character objects OBM that have remained after the row direction integration process for each column in the vertical direction (a column direction integration process) as follows.

First, columns are defined for the whole area corresponding to the original image DG in accordance with a predetermined rule. Then, a character object OBM located at the uppermost on one column is selected as a reference object. Character objects OBM that are located on the same column as the reference object and within a range of a predetermined distance from the reference object are extracted, and a typical color indicated in a character object OBM is compared with a typical color of the reference object in turn from the character object OBM that has a short distance.

Note that the "character objects OBM that are located on the same column as the reference object" are character objects OBM that cross one or more columns crossing the reference object (i.e., that share at least one column with the reference object), for example.

In addition, the distance between the two character objects OBM in this case can be obtained by subtracting the Y coordinate of the lower end pixel of the upper side character object OBM from the Y coordinate of the upper end pixel of the lower side character object OBM. However, if the two character objects OBM overlap each other, the distance between them is regarded as "0". Alternatively, a distance between their block positions may be used as the distance between two character objects OBM.

When a character object OBM having a difference between the compared typical colors (a character color difference) that is a preset threshold level or lower is found, the reference object and its character object OBM are integrated. In other words, the reference object and the character object OBM that satisfies the condition of being located within the range of a predetermined distance from the reference object and having a character color difference of a predetermined threshold level or lower are integrated.

Next, the character object OBM generated newly by the integration is regarded as a next reference object for performing the process described above. If there is no character object OBM that satisfies the above-mentioned condition, a character object OBM that is located on the same column as the reference object and neighbors the reference object on the lower side is regarded as a next reference object for performing the above-mentioned process. Then, the above-mentioned process is repeated until the lowermost character object OBM on the column becomes the reference object OBM. This process is performed on every defined column.

The whole integrating portion 153 performs the integration process (whole integration process) on character objects OBM that have remained after the column direction integration process. This whole integration process will be described with reference to FIGS. 17A and 17B.

Figure 17B:
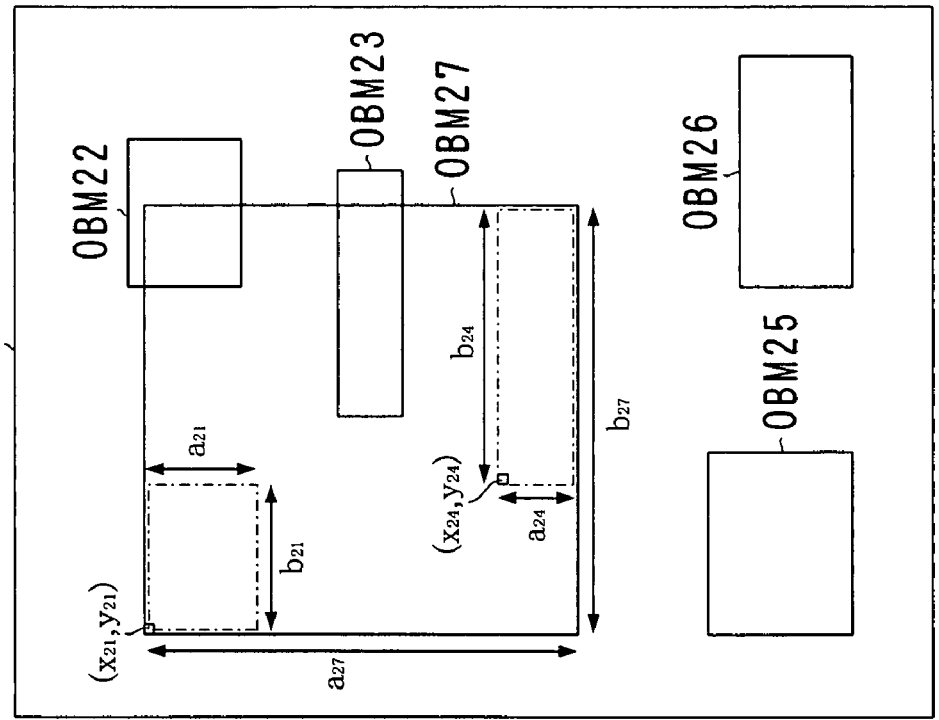
FIGS. 17A and 17B are diagrams for explaining a whole integration process.
Figure 17A:
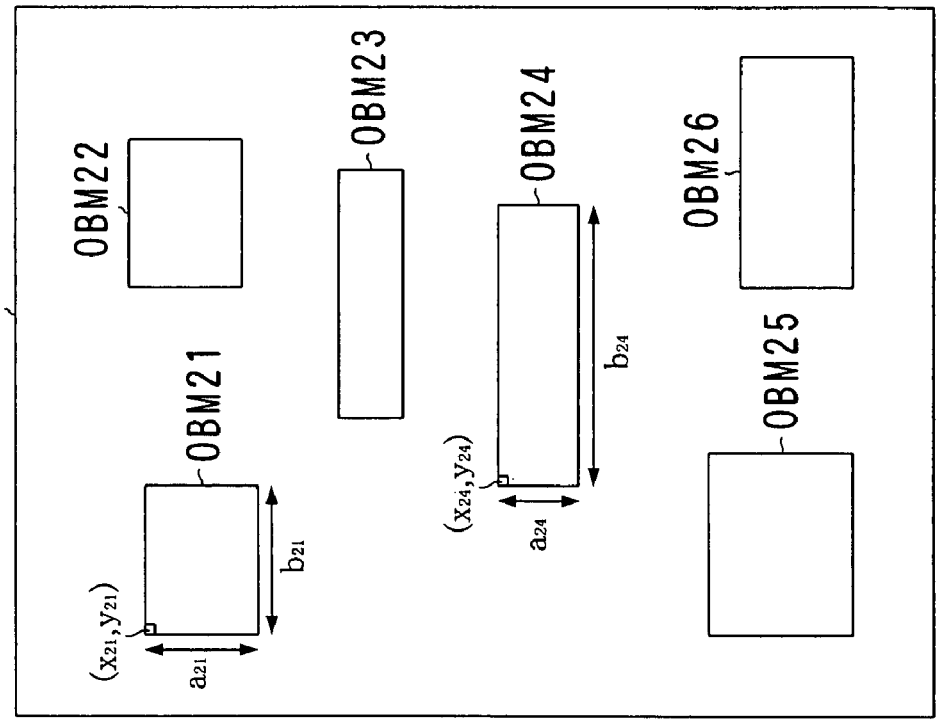

FIG. 17A shows character objects OBM21, OBM22, OBM23, OBM24, OBM25 and OBM26 that have remained after the row direction integration process and the column direction integration process. First, two character objects OBM having the same typical color are extracted from them.

Next, the number of pixels included in the rectangular areas of the extracted two character objects OBM (the number of pixels included in the character objects OBM) and the number of pixels included in the character object OBM after the integration processes are calculated. The number of pixels is determined by a vertical length (the number of pixels)×a horizontal length (the number of pixels) indicated in the block size of the character object OBM.

For example, if the extracted character objects OBM that were extracted as having the same typical color are the character objects OBM21 and OBM24, the number of pixels $S_{21}$ and $S_{24}$ included in the two character objects OBM are $a_{21} \times b_{21}$ and $a_{24} \times b_{24}$, respectively. In addition, if the two character objects OBM are integrated, the character object OBM after the integration becomes like the character object OBM27 shown in FIG. 17B.

As understood from FIG. 17B, the number of pixels included in the character object OBM27 becomes $(y_{24}-y_{21}+a_{24}) \times (x_{24}-x_{21}+b_{24})$.

In addition, the number of pixels in the two extracted character objects OBM is denoted by $S_1$, and the number of pixels of the character object OBM after the integration process is denoted by $S_0$. Then, it is determined whether or not the following inequality holds.

$$S_0/S_1 < \text{threshold level}$$

If this inequality holds, the two extracted character objects OBM are integrated actually. In the example shown in FIG. 17, $S_0$ is equal to $(y_{24}-y_{21}+a_{24}) \times (x_{24}-x_{21}+b_{24})$, while $S_1$ is equal to $(a_{21} \times b_{21} + a_{24} \times b_{24})$. Therefore, if the inequality "$(y_{24}-y_{21}+a_{24}) \times (x_{24}-x_{21}+b_{24})/(a_{21} \times b_{21} + a_{24} \times b_{24}) < \text{threshold level}$" holds, the character objects OBM21 and OBM24 are integrated actually, and the character object OBM27 is generated. If the above inequality does not hold, the integration process is not performed.

In addition, other combinations of two character objects OBM having the same typical color are extracted, and the same determination whether or not the above inequality holds is performed. If the inequality holds, they are integrated. This process is repeated until it is completed for every combination of character objects OBM having the same typical color. Although two character objects OBM having the same typical color are extracted here, it is possible to extract two character objects OBM having similar typical colors, i.e., two character objects OBM having a character color difference between them that is a predetermined threshold level or less.

Pixels in the part except the rectangular areas of the two character objects OBM (increased part) before the integration process in the rectangular area of the character object OBM after the integration process, i.e., pixels in the part except the part corresponding to the rectangular areas of the character objects OBM21 and OBM24 in the character object OBM27 in the example shown in FIG. 17, are unnecessary pixels (unnecessary blank pixels) without dots. Since pixels in this increased part become continuous blank pixels, the quantity of data can be reduced substantially by the compression performed by the lossless compression process portion 16 later.

Therefore, even if the block size of the character object OBM after the integration process becomes conspicuously larger than the block size of the two character objects OBM, quantity of data of the compressed data generated by the compression process performed by the lossless compression process portion 16 is not increased so much.

However, since printing process is performed based on the information indicating that the pixel is a blank pixel for the unnecessary blank pixel too, it takes time undesirably to print the unnecessary blank pixels if the number of the unnecessary blank pixels increases.

In this embodiment, if the block size of the character object OBM increases conspicuously by the integration process, the integration is not performed. In this way, degree of increase of the unnecessary blank pixels is considered for performing the whole integration process, so that a bad influence of lowering printing speed can be avoided.

The second whole integrating portion 154 performs a process (reintegration process) for integrating the character object OBM again as a whole so that the number of character objects OBM that have remained after the whole integration process becomes a limited number (layer upper limit), which is a predetermined threshold level or less. This process is performed as follows.

First, the number of character objects OBM that have remained after the whole integration process is determined, so that the number is compared with the limited number. If the number of the character objects OBM is the limited number or less, the process is finished without performing the integration. If the number of character objects OBM exceeds the limited number, the process for reducing the number of character objects OBM by integrating the same is performed.

When the process is performed, two character objects OBM are selected first, and density values of the R, G and B colors of typical colors of the character objects OBM that are generated when it is supposed that they are integrated. Each of the typical colors of the selected character objects OBM is compared with the calculated typical color so that character color differences are determined for them. This comparison is performed for every combination of the character objects OBM that have remained after the whole integration process, and the character color difference is determined for every combination. Then, the character objects OBM having the smallest character color difference between them are integrated.

After the integration, the number of character objects OBM that have remained is compared with the limited number. If the number of character objects OBM is the limited number or less, the process is finished. If the number of character objects OBM exceeds the limited number, typical colors of the character objects OBM are compared with each other in every combination, and the character objects OBM having the smallest character color difference between them are integrated. This process is repeated until the number of character objects OBM becomes the limited number or less.

Here, this reintegration process will be described specifically with reference to FIG. 18. Here, the case where the number of character objects OBM that have remained after the whole integration process is six while the limited number is "4" is exemplified. Note that the character object OBM is referred to as "OBM" in FIG. 18.

Figure 18:
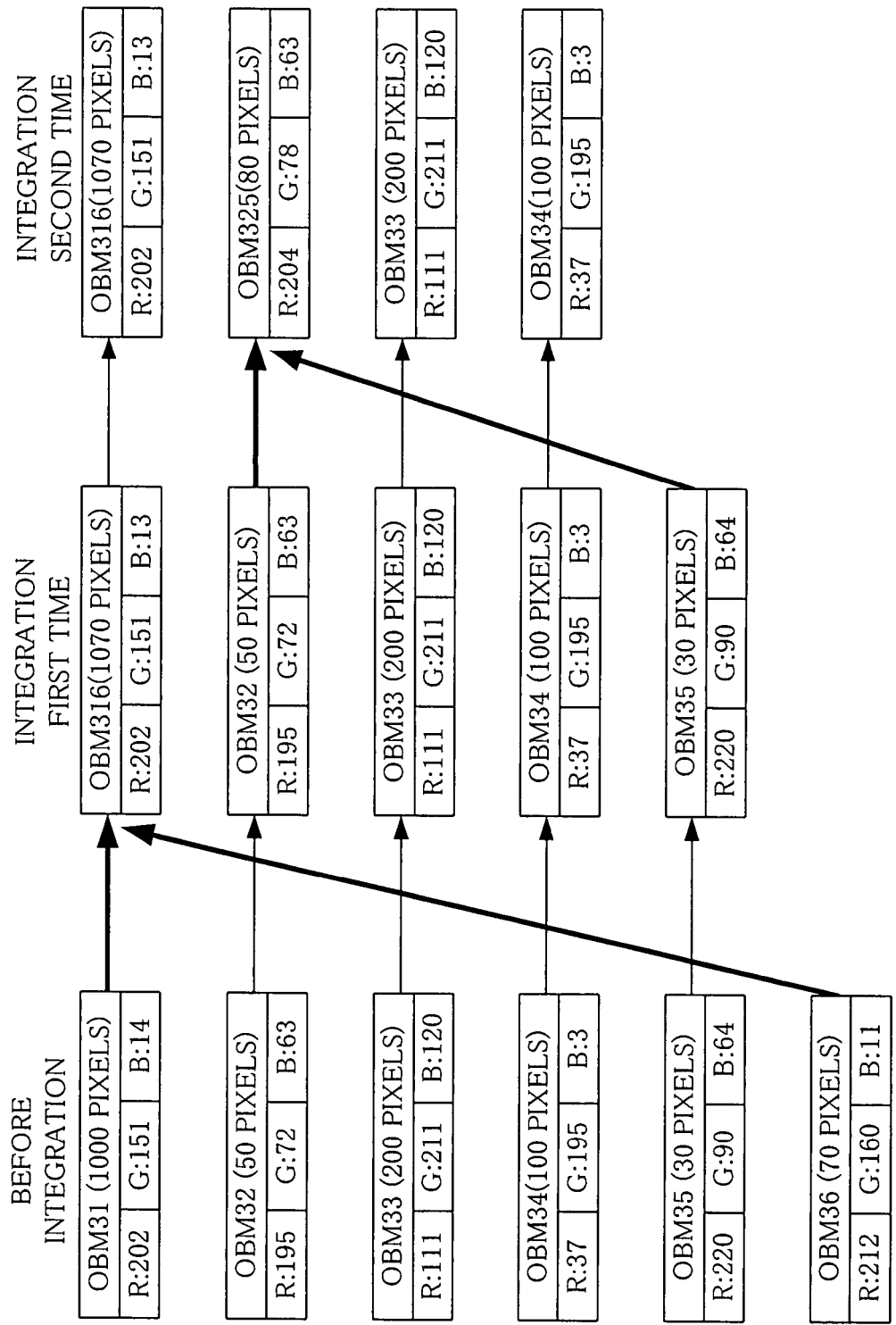
FIG. 18 is a diagram for explaining a reintegration process.

FIG. 18 shows character objects OBM in a state after the whole integration process, i.e., a state before the reintegration process is performed (BEFORE INTEGRATION), in a state after a first integration in the reintegration process (INTEGRATION FIRST TIME), and in a state after a second integration (INTEGRATION SECOND TIME), respectively. In addition, the number of pixels included in the character object OBM and the R, G and B density values are shown for each of the character objects OBM.

In FIG. 18, the number of the character objects OBM before the integration is six, which is larger than the limited number "4". Therefore, the second whole integrating portion 154 performs the process for reducing the number of character objects OBM by integrating them so that the number of character objects OBM becomes four or less.

On this occasion, two character objects OBM31 and OBM32 are selected first. Then, each of typical colors of them is compared with a typical color of a character object OBM312 that is generated when it is supposed that they are integrated, and a character color difference is calculated for each of them.

When the character color difference is determined, density values of the R, G and B colors of the character object OBM312 after the integration process are calculated first. Each of the density values of the R, G and B colors can be determined by weighted average calculation as shown in the equation below, for example, when the two character objects OBM before the integration process is referred to as character objects OBMa and OBMb, and the character object OBM generated after the integration process is referred to as a character object OBMc. Note that density values of the R, G and B colors of a typical color of the character object OBM generated after the integration process can be determined by the following equation similarly in the row direction integration process, the column direction integration process and the whole integration process, too.

$$Dc=(Da \times Na+Db \times Nb)/Na+Nb \quad (1)$$

Here, Na is the number of pixels included in the character object OBMa, Nb is the number of pixels included in the character object OBMb, Da is a density value of the R, G or B color of the character object OBMa, Db is a density value of the R, G or B color of the character object OBMb, and Dc is a density value of the R, G or B color of the character object OBMc.

Therefore, a density value of the R color when the character objects OBM31 and OBM32 are integrated, i.e., a density value of the R color of a typical color of the character object OBM312 is expressed as below.

$$(202 \times 1000+195 \times 50)/1050=201$$

In the same way, density values of the G and B are "147" and "16", respectively

Next, character color differences are determined respectively between the character objects OBM before the integration process and the character object OBM after the integration process. The character color difference can be determined by the following equation, for example, when density values of the R, G and B colors of the character object OBM before the integration process are denoted by "R0", "G0" and "B0", respectively, and density values of the R, G and B colors of the character object OBM after the integration process are denoted by "R1", "G1" and "B1". Note that the character color difference can be determined similarly by the following equation in the row direction integration process, the column direction integration process and the whole integration process, too.

$$\text{character color difference} = \sqrt{(R1-R0)^2+(G1-G0)^2+(B1-B0)^2} \quad (2)$$

Therefore, a character color difference between the character object OBM31 and the character object 312 after the integration process is expressed as below.

$$\sqrt{(202-201)^2+(151-147)^2+(14-16)^2}=5 \quad (3)$$

In addition, a character color difference between the character object OBM32 and the character object 312 after the integration process is expressed as below.

$$\sqrt{(195-201)^2+(72-147)^2+(63-16)^2}=89 \quad (4)$$

In the same way, the character color difference is determined for every other combination, so that values shown in Table TB1 in FIG. 19 are obtained.

In FIG. 19, attribution values and the like of the character objects OBMa and OBMb before the integration process are shown in the field "BEFORE INTEGRATION". For each of them, a number corresponding to the character object OBM is shown in the field "NUMBER". This number is a serial number assigned to the reference sign "OBM" of the character object OBM. In the field "NUMBER OF PIXELS", the number of pixels included in the character object OBM is shown. In the fields "R", "G" and "B", density values of the R, G and B colors of a typical color of the character object OBM are shown, respectively.

In addition, the number of pixels and density values of the R, G and B colors of the character object OBMc after the integration process when they are integrated are shown in the field "CHARACTER OBJECT OBMc AFTER INTEGRATION". The character color differences between the character object OBMa as well as OBMb and the character object OBMc after the integration process are shown in the field "CHARACTER COLOR DIFFERNCE BEFORE AND AFTER INTEGRATION".

In the field "CHARACTER COLOR DIFFERNCE BEFORE AND AFTER INTEGRATION", the character color difference between the character object OBMa and the character object OBMc is shown in the field "OBMa" while the character color difference between the character object OBMb and the character object OBMc is shown in the field "OBMb". A larger value of the character color differences shown in the fields "OBMa" and "OBMb" (a typical color difference) is shown in the field "MAX".

When the character color difference is determined for every combination, the second whole integrating portion 154 integrates character objects OBM of a combination having the smallest typical color difference.

As understood from the values shown in the field "MAX" in FIG. 19, the typical color difference become the smallest value "14" when the character objects OBM31 and OBM36 are integrated in this example. Therefore, the character objects OBM31 and OBM36 are integrated.

As shown in "INTEGRATION FIRST TIME" of FIG. 18, the character object 316 is newly generated by this integration process, so the number of character objects OBM is reduced to five as a whole.

After the integration process, the number of character objects OBM is compared with the limited number again. In the example shown in FIG. 18, the number of character objects OBM is five, which is still larger than the limited number "4". Therefore, the above-mentioned process is repeated for the five character objects OBM that have remained.

When each value is determined for the five character objects OBM similarly to the case of Table TB1 shown in FIG. 19, Table TB2 as shown in FIG. 20 is obtained. According to values shown in the field "MAX" in Table TB2, the typical color difference when the character object OBM2 and the character object OBM5 are integrated becomes the minimum value "20". Therefore, the character object OBM2 and the character object OBM5 are integrated.

When the character object OBM2 and the character object OBM5 are integrated, the character object OBM325 is newly generated as shown in "INTEGRATION SECOND TIME" in FIG. 18. Thus, the number of objects is reduced to four as a whole.

By the integration of the second time, the number of character objects OBM becomes the limited number or less. Therefore, the reintegration process is finished at this time point.

The character object OBM is associated with one typical color that represents a color of the character included in it. For this reason, the number of character colors used in the PDF file that is finally generated (character color number) depends on the number of character objects OBM. Therefore, limit of the number of character objects OBM means limit of the number of character colors that are used in the PDF file.

Therefore, the limited number in the reintegration process can be called a "character color limit value". In addition, this reintegration process can be called a "character color limiting process".

In this embodiment, the user can set the character color limit value by the scan set item M131 shown in FIG. 3.

Furthermore, in this embodiment, the user can set, by the scan set item M132, a quantity of data (a file size) of the PDF file to be generated. When the file size is set, the image processing device 1 performs the process for generating the PDF file that fits in the file size. This process can be called a "file size limiting process" with respect to the character color limiting process. This file size limiting process will be described in detail later in [Description of file size limiting process].

Although an example of the case where the integration of the character objects OBM is performed by the integration process portion 15 is described in this embodiment, it is possible to integrate the character objects OBM that neighbor to each other and have the same typical color or similar typical colors in advance when the typical colors are determined in the process of the character color discrimination process portion 114.

Furthermore, in this embodiment, a larger value of the character color differences between two character objects OBM before the integration process and the character object OBM after the integration process is regarded as the typical color difference, it is possible to regard a smaller value as the typical color difference.

In addition, it is possible to provide a limit that the reintegration process is permitted only when the typical color difference is smaller than a predetermined value.

[Description by Flowcharts]

Next, with reference to the flowchart shown in FIG. 21, a general flow of a process until a PDF file is generated for a scanned original by the image processing device 1 will be described.

Figure 21:
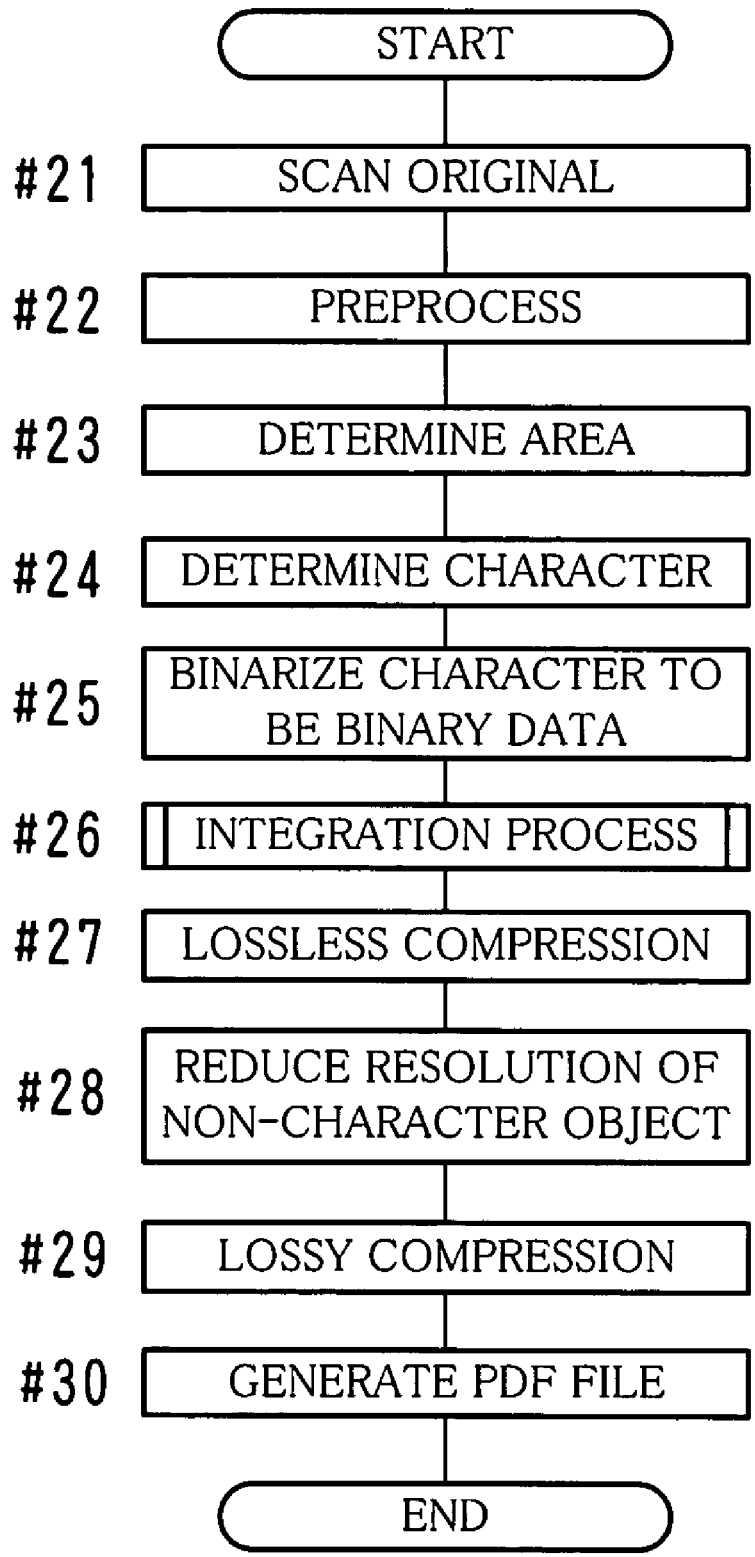
FIG. 21 is a flowchart for explaining a general flow of a process until a PDF file is generated by the image processing device.

In FIG. 21, the scanner 10a scans an original (#21), and then the image processing device 1 performs the preprocess on the original image DG obtained from the scanner 10a, which includes conversion of the image format, conversion of the resolution and ground removal (#22).

The brightness image DM is generated from the original image DG, and the object OB included in it is extracted. A rectangular area of the extracted object OB is determined to be a drawing area, a photograph area, a table area, a ground area or a character area (#23).

It is determined whether or not the object OB includes a character (#24). Here, a method of determination is changed in accordance with the result of the determination in the step #23.

A block image of the character object OBM that is the object OB decided to include a character is binarized to be binary data (#25), and after that the integration process is performed (#26).

The MMR compression process is performed on the object image of the character object OBM that has remained after the integration process in the step #26 in a lossless compression manner (#27).

The resolution of the object image of the non-character object OBH that is the object OB decided not to include a character in the step #24 is reduced (#28), and then the object image is compressed in a lossy compression manner by JPEG or the like (#29).

A PDF file is generated based on the character object OBM and the non-character object OBH on which the compression process has been performed in the step #27 and the step #29 (#30).

Although the object image of the character object OBM is compressed in the step #27 in this embodiment, it is possible to compress the whole of the character object OBM. Similarly, it is possible to compress the whole of the non-character object OBH in the step #29.

Figure 22:
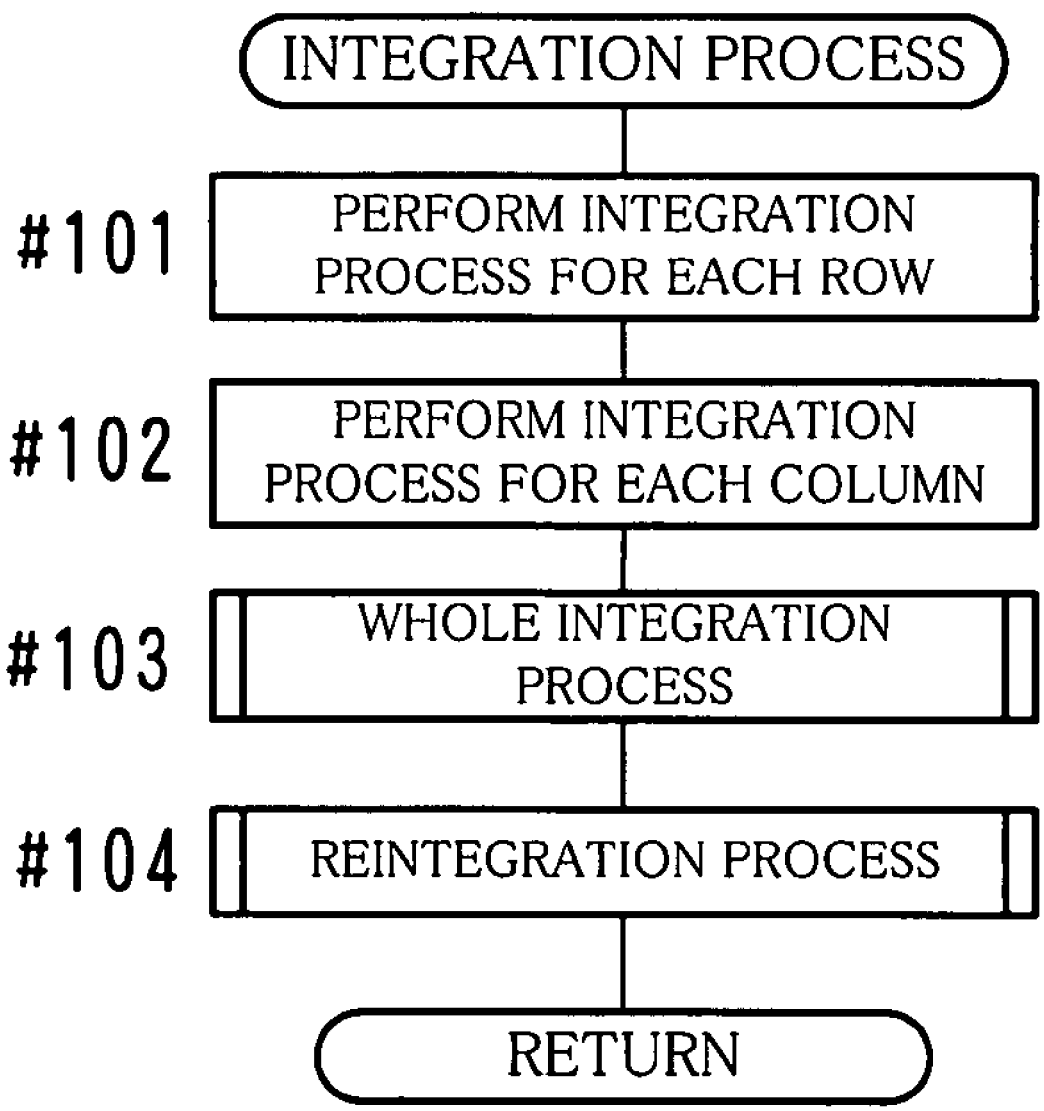
FIG. 22 is a flowchart for explaining a flow of an integration process.

Referring to FIG. 22, a flowchart for explaining a flow of an integration process in the step #26 is indicated.

In FIG. 22, two character objects OBM that are within a predetermined distance from each other in the horizontal direction and have similar typical colors are searched, and the two character objects OBM are integrated. This process is repeated. This integration process is performed for each row (#101).

Among the character objects OBM that have remained after the integration process in the step #101, two character objects. OBM that are within a predetermined distance from each other in the vertical direction and have similar typical colors are searched, and the two character objects OBM are integrated. This process is repeated. This integration process is performed for each column (#102).

The whole integration process is performed for the character objects OBM that have remained after the integration process in the step #102 (#103).

The reintegration process is performed for the character objects OBM that have remained after the whole integration process in the step #103 (#104).

Figure 23:
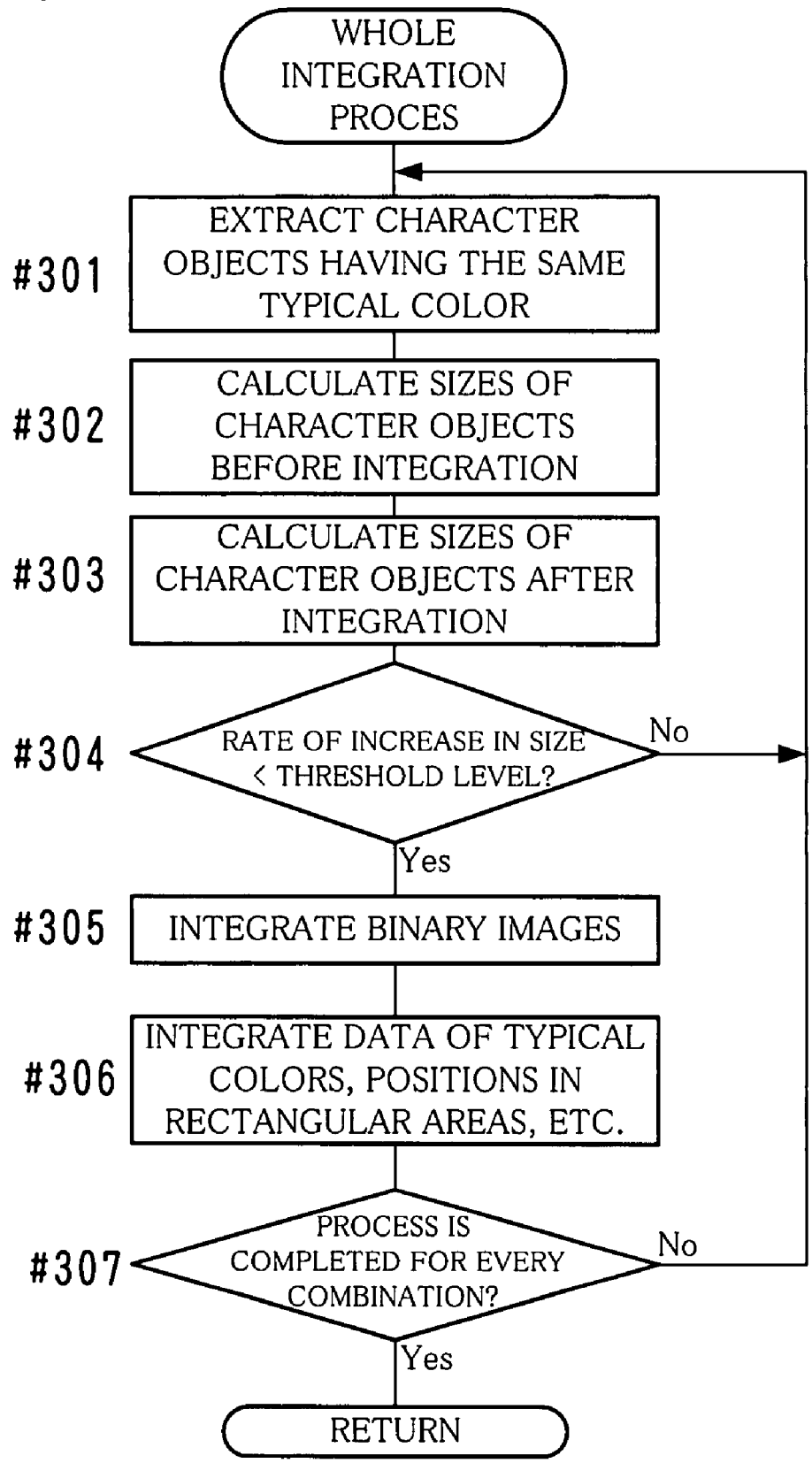
FIG. 23 is a flowchart for explaining a flow of the whole integration process.

In FIG. 23, a flow of the whole integration process in the step #103 is indicated. Next, a flow of the whole integration process will be described with reference to the flowchart shown in FIG. 23.

In FIG. 23, two character objects OBM having the same typical color are extracted first (#301). Block sizes of the extracted character objects OBM are determined (#302). In addition, a block size of the character object OBM after the integration process for integrating the two character objects is determined (#303). Then, a sum of block sizes of the two character objects OBM before the integration process is compared with the block size of the character object after the integration process (#304).

As a result of the comparison, if the block size increases substantially, i.e., the rate of increase is a predetermined threshold level or more (No in #304), the process of the step #301 and succeeding steps is repeated. In the process of the step #301, in the second time and after that, the character objects OBM are extracted in combinations except for the combinations that have been extracted.

If the rate of increase is less than the predetermined threshold level (Yes in #304), the two character objects OBM are integrated. More specifically, the rectangular area of the character object OBM after the integration process is determined based on the rectangular area of the two character objects OBM before the integration process, and the image included in it is stored as the object image of the character object OBM. Thus, the object images (object binary images GN) included in the two character objects OBM before the integration process are integrated (#305). In addition, a typical color, a block position and a block size of the character object OBM after the integration process is determined based on the attribution value of the two character objects OBM before the integration process, and they are stored as a typical color, a block position and a block size of the character object OBM after the integration process. Thus, data indicating typical colors, block positions and block sizes of the two character objects OBM before the integration process are integrated (#306).

If the process until the step #306 is not completed for every combination of the character objects OBM having the same typical color (No in #307), the process of the step #301 and succeeding steps is repeated. When it is completed (Yes in #307), the whole integration process is finished.

Next, with reference to the flowchart shown in FIG. 24, a flow of the reintegration process will be described.

Figure 24:
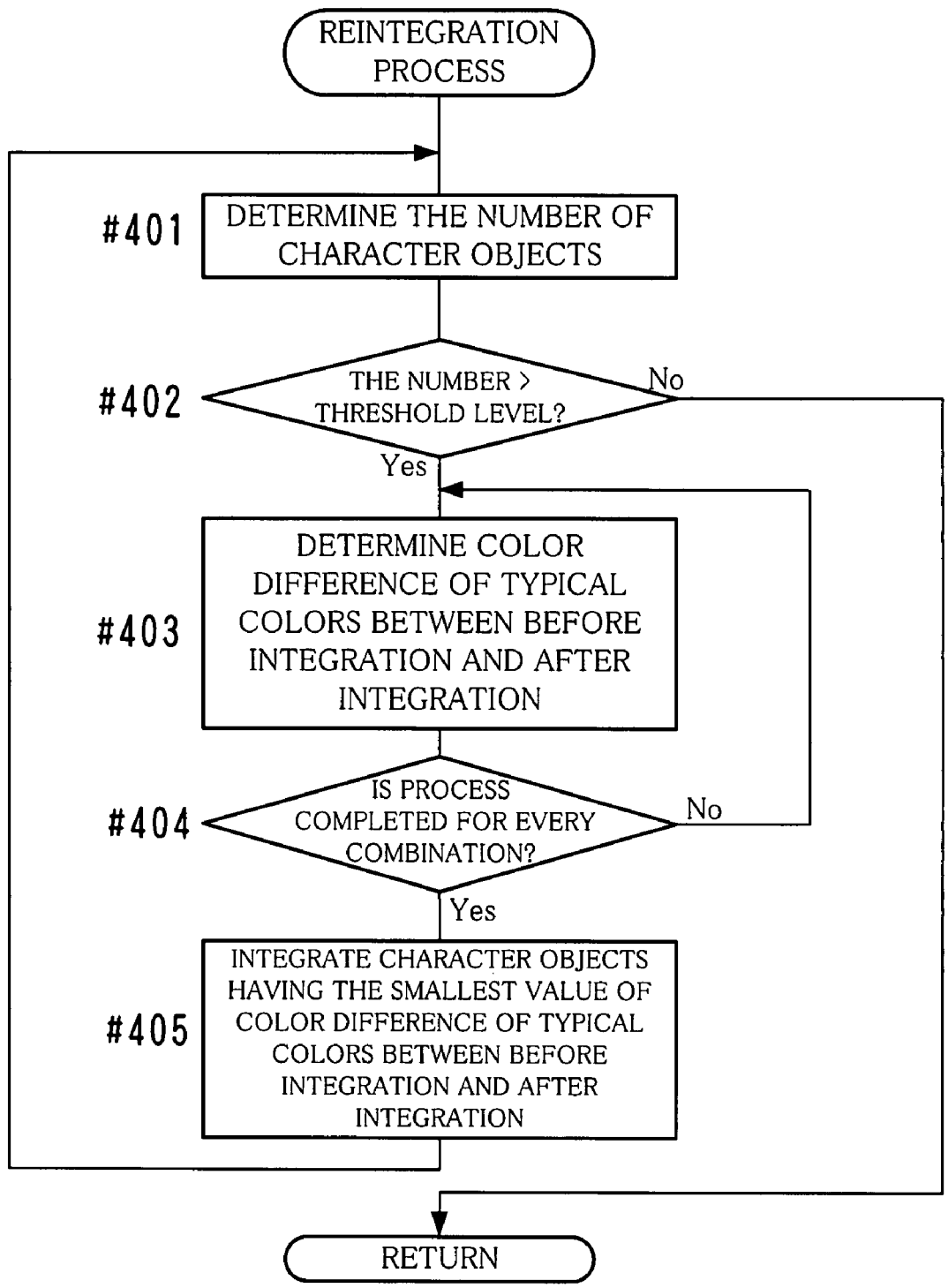
FIG. 24 is a flowchart for explaining a flow of the reintegration process.

In FIG. 24, the character objects OBM that have remained are counted, and the number of them is determined first (#401). If the number is less than or equal to the limited number that is a predetermined threshold level (No in #402), the reintegration process is finished.

If the number exceeds the limited number (Yes in #402), two character objects OBM are selected from the character objects OBM that have remained, and character color differences are determined between each typical color of them and a typical color of the character object OBM after the integration process for integrating them (#403). The process of the step #403 is repeated for every combination of the character objects OBM that have remained (No in #404).

When the process in the step #403 is finished for every combination (Yes in #404), the character objects OBM having the smallest value of the larger one of two character color differences that have determined for every combination are integrated (#405), and the process of the step #401 and the succeeding steps is repeated. In step #401, in the second time and after that, it is possible to determine the number in that time by subtracting one from the number determined last time.

Next, an example will be described, in which a file size limiting process is performed when the lossy compression is performed on a non-character object, adding to the process of integrating character objects described above.

[Description of File Size Limiting Process]

Figure 25:
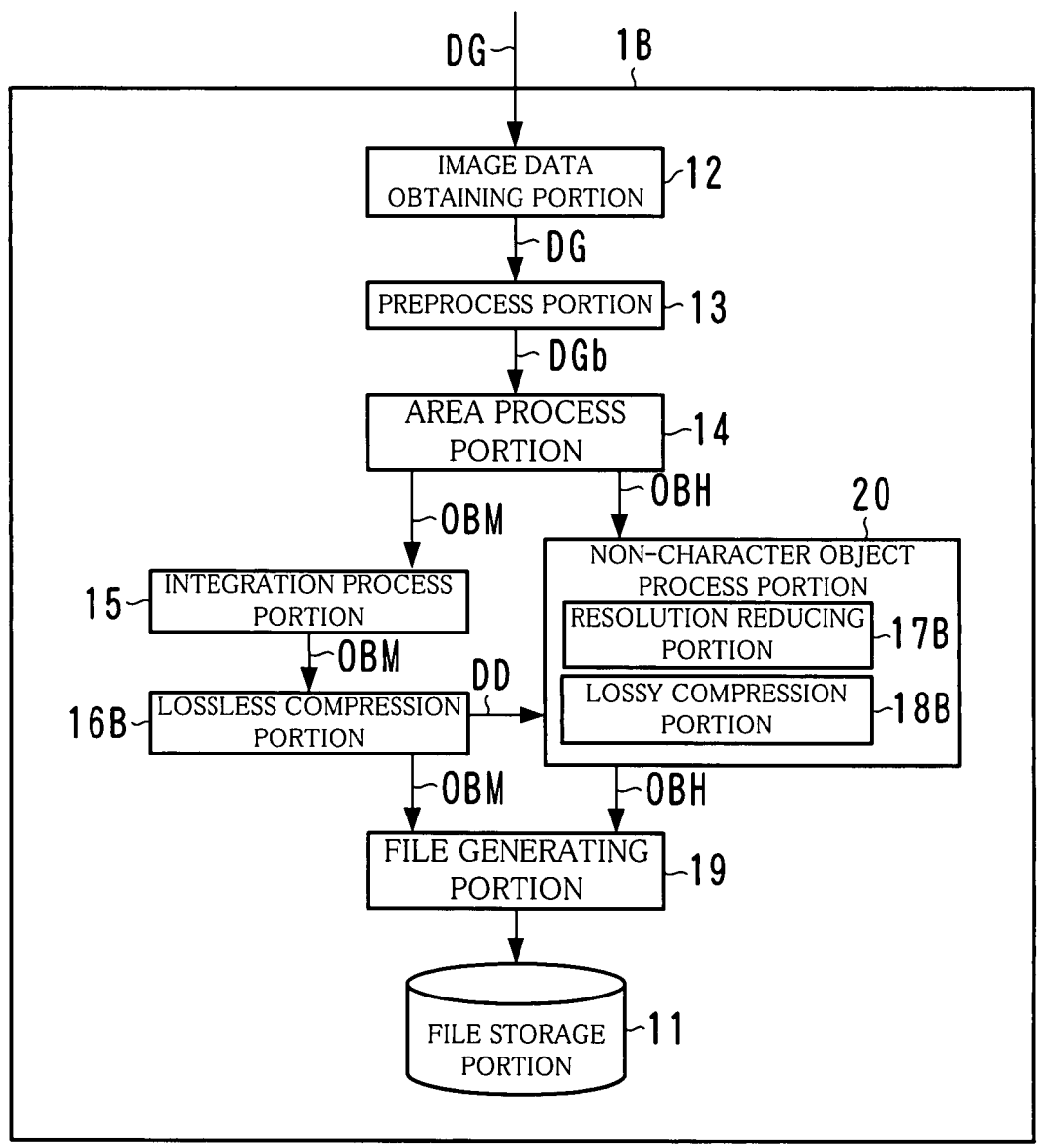
FIG. 25 is a diagram showing an example of a functional structure of an image processing device according to another embodiment of the present invention.

In order to perform the file size limiting process, the image processing device 1 is constituted like the image processing device 1B shown in FIG. 25. The image processing device 1B performs a process for generating a file having a quantity of data less than or equal to a file size upper limit value that is an upper limit value of a file size (a limit value) set in advance by the user or the like.

In FIG. 25, the image processing device 1B is made up of a file storage portion 11, an image data obtaining portion 12, a preprocess portion 13, an area process portion 14, an integration process portion 15, a lossless compression portion 16B, a file generating portion 19, a non-character object process portion 20 and the like.

Here, process contents of the file storage portion 11, the image data obtaining portion 12, the preprocess portion 13, the area process portion 14, the integration process portion 15 and the file generating portion 19 are the same as described with reference to FIG. 4. Therefore, description of them will be omitted.

The lossless compression portion 16B performs the MMR compression process on the object images of the character objects OBM that have remained after the integration process. A quantity of reversibly compressed data DD is determined, which indicates a sum of quantity of data of all the character objects OBM on which the compression process has been performed.

The non-character object process portion 20 is made up of a resolution reducing portion 17B, a lossy compression portion 18B and the like. This non-character object process portion 20 performs the reduction of resolution and a compression process by JPEG on the non-character object OBH as follows.

First, the quantity of reversibly compressed data DD is obtained from the lossless compression portion 16B, and a difference is determined between a value of the quantity of reversibly compressed data DD and the file size upper limit value.

The determined difference is a capacity (remaining capacity) that has remained after subtracting total data of the character object OBM from a capacity indicated by the file size upper limit value. It also indicates a capacity that can be used for the non-character object OBH. In other words, it is a capacity that can be used for the background area.

Based on the determined remaining capacity, it is determined which level should the resolution of the object image of the non-character object OBH be reduced to. In other words, a target resolution (a target background resolution) in reducing the resolution is determined. In addition, based on the determined remaining capacity, compression parameter (compression intensity) that is a parameter for compression by JPEG is determined.

Then, the resolution reducing portion 17B reduces the resolution of the object image of each non-character object OBH to the target resolution. Thus, the resolution of 300 dpi is reduced to the target resolution of 150 dpi, for example.

Next, the lossy compression portion 18B compresses by JPEG the object image of the non-character object OBH whose resolution was reduced. On this occasion, the compression parameter determined as described above is used.

The quantity of non-reversibly compressed data that is a sum of quantities of data of all the non-character objects OBH on which the compression by JPEG was performed is compared with the remaining capacity, so as to determine whether or not the quantity of non-reversibly compressed data is the remaining capacity or less. If it is not the remaining capacity or less, the target resolution and the compression parameter are reset depending on the quantity of data that have exceeded the remaining capacity. And then, the resolution reducing process and the compression process by JPEG are performed again. The above-mentioned process is repeated until the quantity of non-reversibly compressed data becomes the remaining capacity or less.

If the quantity of non-reversibly compressed data becomes the remaining capacity or less, the non-character object OBH is outputted to the file generating portion 19.

In addition, it is possible to perform a process for determining whether the quantity of non-reversibly compressed data fits in the remaining capacity prior to the resolution reducing process or the like. Then, if it is determined that it does not fit in the remaining capacity, the determination result is provided to the user so as to recommend that the file size upper limit value, the target resolution, the compression parameter and the like be changed.

In this determination, if a difference between the quantity of data of the non-character object OBH to be compressed and the remaining capacity is a predetermined threshold level or more for example, it is determined that it does not fit in the remaining capacity. Alternatively, a quantity of non-reversibly compressed data is calculated on a trial basis by using the target resolution and the compression parameter. If a difference between the calculated quantity of non-reversibly compressed data and the remaining capacity is a predetermined threshold level or more, it is determined that it does not fit in the remaining capacity.

[Description of File Size Limiting Process Using Flowchart]

Figure 26:
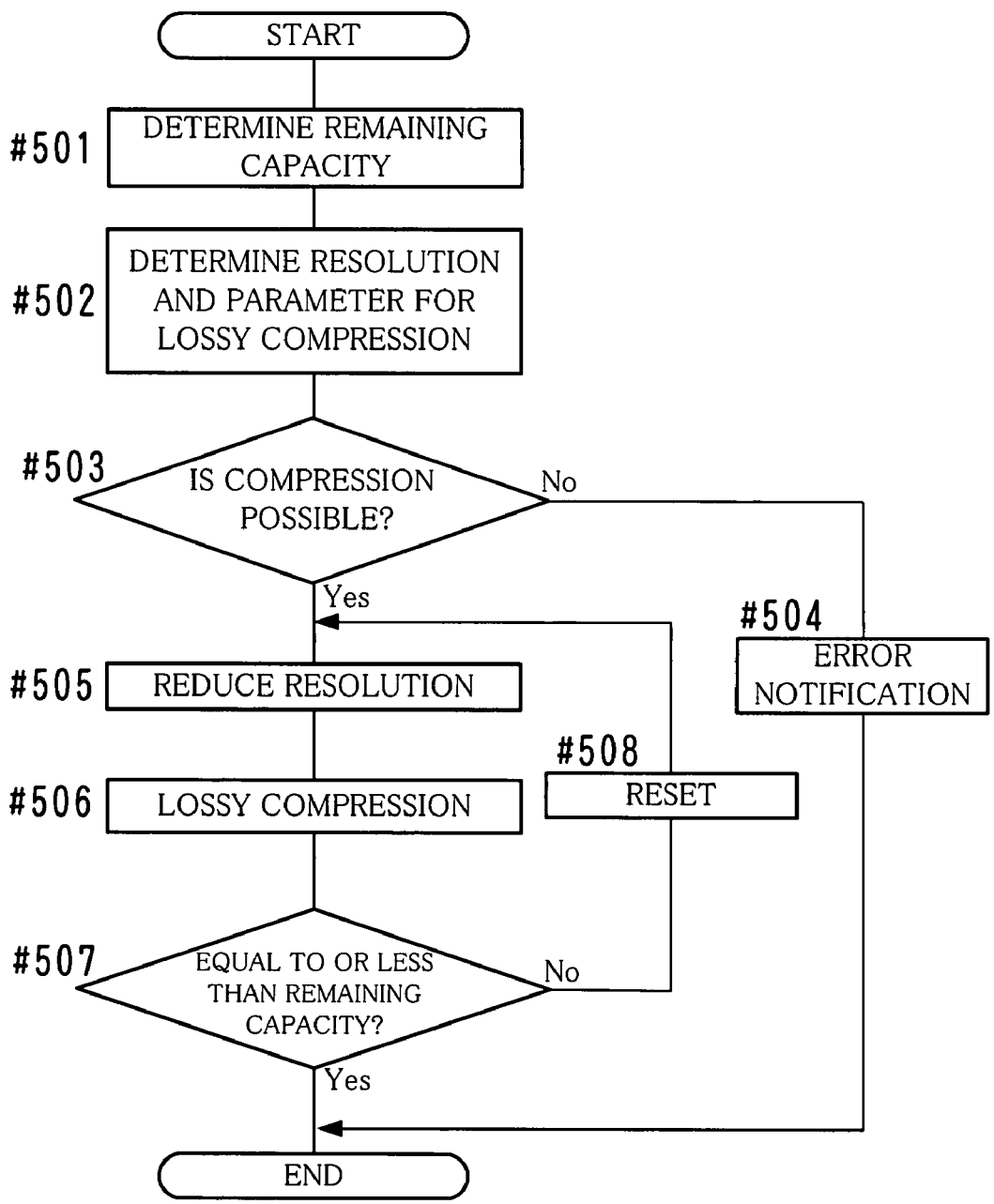
FIG. 26 is a flowchart for explaining a flow of a file size limiting process.

In FIG. 26, a remaining capacity is determined in accordance with a total quantity of data of the character objects OBM on which the MMR compression process was performed and the file upper limit value that was set in advance (#501).

The target resolution and the compression parameter that is used for the JPEG compression are determined based on the determined remaining capacity (#502). The quantity of non-reversibly compressed data is calculated on a trial basis from the determined target resolution and compression parameter, and it is determined whether or not the quantity of non-reversibly compressed data becomes the remaining capacity or less. In other words, it is determined whether or not compression down to the remaining capacity or less is possible (#503).

If it is determined not to be possible (No in #503), a message of the determination result is displayed on the display device TP of the operation panel 10k so that the user is informed (#504). Then, the process is finished. The user who confirmed the information sets the file size upper limit value again for retrying.

If it is determined that the compression down to the remaining capacity or less is possible (Yes in #503), the resolution of the object image of the non-character object OBH is reduced to be the target resolution that was determined in the step #502 (#505). Further, the JEPG compression is performed by using the compression parameter determined in the step #502 (#506). It is determined whether or not the total quantity of data of the non-character object on which the compression process was performed (quantity of non-reversibly compressed data) has become the remaining capacity or less actually (#507).

If it is not the remaining capacity or less (No in #507), the target resolution and the compression parameter are set again (adjusted) based on the quantity of data that have exceeded the remaining capacity (#508). Then, the process of the step #505 and the succeeding steps is repeated until the quantity of non-reversibly compressed data becomes the remaining capacity or less.

When the quantity of non-reversibly compressed data becomes the remaining capacity or less (Yes in #507), the process is finished.

In this embodiment, the character object OBM is generated for each of characters or words, and one typical color is determined for the character object OBM. Then, neighboring character objects OBM having the same original character color or similar ones are integrated, and a typical color of the character object OBM after the integration is determined based on the typical colors of the character objects OBM before the integration process. This integration process is once performed by line or column (by paragraph), and character objects OBM that have remained and have a relationship of a predetermined condition are further integrated. After that, if the number of character objects OBM that have remained exceeds the limited number, character objects OBM having the nearest typical colors are integrated.

In this way, a variation between the typical colors before and after the integration process can be reduced to a minimum.

In addition, the number of character objects OBM can be reduced without generating unevenness of colors so that a file size can be reduced appropriately.

In addition, this embodiment is different from the conventional method in which attributions of all the objects are compared with each other in every combination from the first. In this embodiment, the row direction integration process, the column direction integration process, and the whole integration process are performed first. After that, the comparison in every combination is performed in the reintegration process. In many cases, the number of character objects OBM is reduced substantially when the whole integration process is finished. Therefore, the comparison in every combination in the reintegration process needs less quantity of calculation than the conventional comparison in every combination.

Further, in this embodiment, the lossless compression is performed on an image in a character area (an object image of a character object OBM) without changing its high resolution. A resolution of an image in a background area such as a photograph area or a drawing area (an object image of a non-character object OBH) is reduced before the lossy compression. In other words, image quality is given higher priority for a character area, while reduction of quantity of data is given higher priority than image quality for a background area. Thus, a PDF file with a high compressibility and good character legibility can be generated.

In addition, a target resolution for reducing resolution of an image in the background area and a compression parameter for lossy compression are determined based on the quantity of reversibly compressed data DD and file size upper limit value. Then, resolution of the background area image is reduced to the target resolution, and the lossy compression is performed based on the compression parameter. As to the character area, the lossless compression is performed without changing its high resolution. Thus, an optimal compression can be performed on images in the character area and the background area while maintaining appropriate resolutions.

Although an example of the case where an MFP is used as the image processing device 1 is shown in this embodiment, it is possible to use a personal computer, a workstation or the like. In this case, a scanner and a printer are connected externally to the personal computer or the like, and a program or the like may be installed in the same for realizing functions of the portions shown in FIG. 4 or 25.

In addition, it is possible to realize a part of the functions shown in FIG. 4 or 25 with hardware. For example, hardware for an input image processing portion, an output image processing portion and the like may be provided to the image processing device 1. The input image processing portion receives an original image DG from the scanner 10a and performs a process including color conversion, color correction, resolution conversion, area discrimination and the like on the original image DG. The processed data may be stored in the hard disk 10c, the RAM 10d, the ROM 10e or the like.

When the printing process is performed based on the stored data, prior to the printing process by the printing device 10f, the output image processing portion performs a screen control, a smoothing process, a PWM control and the like.

Other than that, the structure of a part or the whole of the image processing devices 1 and 1B, the functions thereof, the threshold level, the upper limit value, contents of the data, the method of determining the typical color, the character color difference, a distance between the objects OB or the like, contents or order of the processes and the like can be changed in accordance with the spirit of the present invention.

While example embodiments of the present invention have been shown and described, it will be understood that the present invention is not limited thereto, and that various changes and modifications may be made by those skilled in the art without departing from the scope of the invention as set forth in the appended claims and their equivalents.

What is claimed is:

1. A method for processing input data when an electronic file is generated from the input data, the method comprising:
   receiving the input data as electric signals;
   generating objects indicating specific areas included in the input data;
   integrating objects satisfying a first condition among the generated objects so as to make one object; and
   comparing the number of objects that have remained after a process of the integration with a preset value and integrating objects satisfying a second condition among the remaining objects if the number of objects is larger than the preset value.

2. The method according to claim 1, wherein the process of comparison includes repeating a process of integrating objects satisfying the second condition until the number of objects that have remained after the integration becomes the preset value or less.

3. The method according to claim 1, wherein the second condition is that a difference between an attribution value of one object generated by integration of objects in a certain combination and an attribution value of each object before the integration is smaller than a difference when objects in another combination are integrated.

4. The method according to claim 3, wherein the attribution value is a value about a color of a character included in the object.

5. The method according to claim 1, wherein objects include a character object about an area of characters and a non-character object about an area except for characters, and a process of the integration and the comparison is performed on the character object.

6. The method according to claim 5, wherein the character object that has remained after a process of the comparison is compressed in a lossless compression manner, while the non-character object is compressed in a lossy compression manner.

7. The method according to claim 6, wherein a parameter that is used for the lossy compression is determined based on a quantity of data generated by the lossless compression of the character object.

8. The method according to claim 1, wherein the first condition is that a distance between objects, a color difference between characters included in the objects, and a value indicating a size of a blank part generated by integration of the objects are smaller than predetermined values, respectively.

9. A Non-Transitory computer readable medium storing program instructions executable by an arithmetic processing device, the instructions comprising:
   receiving input data;
   generating in the arithmetic processing device objects indicating specific areas included in the input data;
   integrating objects satisfying a first condition among the generated objects so as to make one object; and
   comparing the number of objects that have remained after a process of the integration with a preset value and integrating objects satisfying a second condition among the remaining objects if the number of objects is larger than the preset value.

10. The Non-Transitory computer readable medium according to claim 9, wherein the process of comparison includes repeating a process of integrating objects satisfying the second condition until the number of objects that have remained after the integration becomes the preset value or less.

11. The Non-Transitory computer readable medium according to claim 9, wherein the second condition is that a difference between an attribution value of one object generated by integration of objects in a certain combination and an attribution value of each object before the integration is smaller than a difference when objects in another combination are integrated.

12. A processing apparatus for generating an electronic file from input data, comprising:
   a generating portion that generates objects indicating specific areas included in the input data;
   a first integrating portion that integrates objects satisfying a first condition among objects generated by the generating portion so as to make one object; and
   a second integrating portion that compares the number of objects that have remained after a process of the integration performed by the first integrating portion with a preset value and integrates objects satisfying a second condition among the remaining objects if the number of objects is larger than the preset value.

13. The processing apparatus according to claim 12, wherein the second integrating portion repeats a process of integrating objects satisfying the second condition until the number of objects that have remained after the integration becomes the preset value or less.

14. The processing apparatus according to claim 12, wherein the second condition is that a difference between an attribution value of one object generated by integration of objects in a certain combination and an attribution value of each object before the integration is smaller than a difference when objects in another combination are integrated.

15. A processing apparatus for generating an electronic file from input data, comprising:
   a generating portion that generates objects indicating specific areas included in the input data;
   a determining portion that determines whether an object generated by the generating portion is a character object about an area of characters or a non-character object about an area except for characters;
   a first integrating portion that integrates objects satisfying a first condition among character objects so as to make one new character object;
   a second integrating portion that compares the number of character objects that have remained after a process of the integration performed by the first integrating portion with a preset value and integrates objects satisfying a second condition among the remaining character objects if the number of character objects is larger than the preset value;
   a lossless compression portion that compresses in a lossless compression manner character objects that have remained after a process of the integration performed by the second integrating portion; and
   a lossy compression portion for compressing non-character objects in a lossy compression manner.

16. The processing apparatus according to claim 15, wherein the second integrating portion repeats a process of integrating objects satisfying the second condition until the number of character objects that have remained after the integration becomes the preset value or less.

17. The processing apparatus according to claim 15, wherein the second condition is that a difference between an attribution value of one object generated by integration of objects in a certain combination and an attribution value of each object before the integration is smaller than a difference when objects in another combination are integrated.

18. The processing apparatus according to claim 15, further comprising a determining portion that determines a parameter for performing a lossy compression process on a non-character object based on a quantity of data generated by the lossless compression process performed by the lossless compression portion, wherein the lossy compression portion performs the lossy compression process based on the parameter.

* * * * *